(12) United States Patent
Dinh et al.

(10) Patent No.: US 10,153,524 B2
(45) Date of Patent: Dec. 11, 2018

(54) VEHICLE COOLING SYSTEM USING GRAVITY BASED FLUID FLOW

(71) Applicant: Faraday&Future Inc., Gardena, CA (US)

(72) Inventors: Khiem Dinh, Hawthorne, CA (US);
David Tarlau, Torrance, CA (US);
Berton Vite, Costa Mesa, CA (US)

(73) Assignee: FARADAY&FUTURE INC., Gardena, CA (US)

( * ) Notice: Subject to any disclaimer, the term of this patent is extended or adjusted under 35 U.S.C. 154(b) by 0 days.

(21) Appl. No.: 15/639,083

(22) Filed: Jun. 30, 2017

(65) Prior Publication Data

US 2018/0145381 A1    May 24, 2018

Related U.S. Application Data

(60) Provisional application No. 62/357,220, filed on Jun. 30, 2016, provisional application No. 62/357,218, filed on Jun. 30, 2016.

(51) Int. Cl.
*B60H 1/00* (2006.01)
*H01M 10/625* (2014.01)
(Continued)

(52) U.S. Cl.
CPC ...... *H01M 10/625* (2015.04); *B60H 1/00278* (2013.01); *B60H 1/143* (2013.01); *F28F 27/02* (2013.01); *H01M 10/613* (2015.04); *H01M 10/63* (2015.04); *H01M 10/6557* (2015.04); *H01M 10/6568* (2015.04); *H05K 7/20327* (2013.01); *H05K 7/20381* (2013.01);
(Continued)

(58) Field of Classification Search
CPC .......... H05K 7/20327; H05K 7/20381; H01M 10/025; H01M 10/613; H01M 10/63; H01M 10/6557; H01M 10/6568; B60H 1/00278; B60H 1/43; B60H 2001/00307; B60H 11/1874; B60H 11/02; F28F 27/02; F28F 2250/06; F28F 2250/08
USPC ........................................................ 165/202
See application file for complete search history.

(56) References Cited

U.S. PATENT DOCUMENTS 9,664,180 B2 * 5/2017 Saavedra ................. F03G 6/02
2004/0250995 A1 * 12/2004 Morishita .............. B60K 11/02
165/80.4

(Continued)

*Primary Examiner* — Davis Hwu
(74) *Attorney, Agent, or Firm* — Veros Legal Solutions, LLP

(57) ABSTRACT

This disclosure relates to techniques for implementing a cooling system for a vehicle heat-generating component wherein a two-phase coolant flows between a heat sink module and a heat radiator module. The heat radiator module can be mounted at a higher elevation within the vehicle than the heat sink module. High and low temperature fluid paths can fluidly couple the heat sink module and the heat radiator module. The heat sink module can be coupled to a heat-generating component.

As the coolant is heated at the heat sink module by heat from the heat-generating component, it can change to a substantially gaseous phase and move, primarily by force of buoyancy, to the heat radiator module via the high temperature fluid path. As the coolant is cooled by the heat radiator module, it can change to a substantially liquid phase and move, primarily by force of gravity, to the heat sink module.

20 Claims, 18 Drawing Sheets

(51) Int. Cl.
*H05K 7/20* (2006.01)
*B60H 1/14* (2006.01)
*F28F 27/02* (2006.01)
*H01M 10/613* (2014.01)
*H01M 10/63* (2014.01)
*H01M 10/6557* (2014.01)
*H01M 10/6568* (2014.01)

(52) U.S. Cl.
CPC ..... *H05K 7/20854* (2013.01); *H05K 7/20881* (2013.01); *B60H 2001/00307* (2013.01); *F28F 2250/06* (2013.01); *F28F 2250/08* (2013.01); *H01M 2220/20* (2013.01)

(56) References Cited

U.S. PATENT DOCUMENTS

2015/0176472 A1* 6/2015 Hutchins .................. F01P 7/16
                                                    701/102
2016/0159246 A1* 6/2016 Jung .................. B60L 11/1874
                                                    62/243

\* cited by examiner

VEHICLE COOLING SYSTEM USING GRAVITY BASED FLUID FLOW

CROSS-REFERENCE TO RELATED APPLICATIONS

This application claims the benefit of U.S. Provisional Application No. 62/357,220, filed Jun. 30, 2016, and titled "VEHICLE COOLING SYSTEM USING GRAVITY BASED FLUID FLOW" and U.S. Provisional Application No. 62/357,218, filed Jun. 30, 2016, and titled "COOLING PLATE," the entireties of which are hereby incorporated by reference.

FIELD

The described embodiments relate generally to techniques for implementing a cooling system for a vehicle cooling system using gravity based fluid flow.

BACKGROUND

Cooling systems for vehicles, such as automobiles, have been developed for use with various propulsion systems, such as internal combustion engines and electric drive vehicles. Efficiencies of cooling system for electric drive vehicles related to regulating thermal energy emanating from a battery cell can impact an electric vehicle's range, safety, and performance. Thus, there is need for improvement in the field of cooling systems for vehicles.

SUMMARY

This disclosure describes various embodiments that relate to techniques for implementing a cooling system, using gravity based coolant flow, for a vehicle battery module.

Disclosed herein is a vehicular cooling system including a heat radiator module having an input port and an output port and a heat sink module having an input port and an output port. The vehicular cooling system can include a high temperature fluid path coupling the output port of the heat sink module to the input port of the heat radiator module, for transferring a two-phase coolant from the heat sink module to the heat radiator module and a low temperature fluid path coupling the output port of the heat radiator module to the input port of the heat sink module, for transferring the two-phase coolant from the heat radiator module to the heat sink module. The heat radiator module can be configured to cool the two-phase coolant into a substantially liquid form, and wherein the heat radiator module is further configured to be located within a vehicle at a higher elevation than the heat sink module, such that the two-phase coolant, in substantially liquid form, is moved from the heat radiator module to the heat sink module primarily by force of gravity. The heat sink module can be configured to be thermally coupled to a heat-generating component located within the vehicle at a lower elevation than the heat radiator module and transfer heat from the heat-generating component to heat the two-phase coolant into a substantially gaseous form, and wherein the heat sink module is configured to be located within the vehicle at lower elevation than the heat radiator module, such that the two-phase coolant, in substantially gaseous form, is moved primarily by force of buoyancy from the heat sink module to the heat radiator module.

The heat-generating component can include a battery module. The heat sink module can include a cooling plate configured to make physical contact with the battery module. The battery module can include an elongated battery and the cooling plate is configured to make physical contact with an axial face of the elongated battery. The vehicular cooling system can further include a reservoir disposed and fluidly coupled between the heat sink module and the heat radiator module. The vehicular cooling system can be configured to circulate the two-phase coolant in substantially liquid form between the heat sink module and reservoir; and the two-phase coolant in substantially gaseous form the reservoir to the heat radiator module. The vehicular cooling system can include a pressure compensation unit configured to adjust an amount of pressure within the system, wherein the system includes a closed loop coolant path isolating the two-phase coolant from an atmosphere external to the system. The vehicular cooling system can include a thermal modulator thermally coupled to coolant flowing through the low temperature fluid path, the thermal modulator configured to remove or add thermal energy to the coolant flowing through the low temperature fluid path.

The vehicular cooling system can include a controller configured to cause the pressure compensation unit to adjust the amount of pressure within the system to regulate an amount of flow induced by gravity based on at least one of: a temperature external to the vehicle; an atmospheric pressure; a difference in pressure between a pressure within the system and an atmospheric pressure; or a combination of the preceding. The vehicular cooling system can include a metering valve configured to variably modulate a pressure difference between two different sections of the closed loop coolant path. The vehicular cooling system can include a pump configured to circulate the two-phase coolant between the heat radiator module and the heat sink module and a bypass value configured to fluidly couple or de-couple the pump from the system.

The vehicular cooling system can include a pump configured to cause the two-phase coolant to flow between the heat radiator module and the heat sink module and a controller. The controller can be configured to enable the pump to cause the two-phase coolant to flow between the heat radiator module and the heat sink module when a condition is met and disable the pump from inducing the two-phase coolant to flow between the heat radiator module and the heat sink module when the condition is not met. The condition can includes at least one of: a temperature external to the vehicle; an atmospheric pressure value external to the vehicle; an internal pressure of the cooling system; an internal temperature of the cooling system; or a combination of the preceding.

In certain embodiments, a modular vehicular cooling system is disclosed, including a heat radiator module, a plurality of heat sink modules, and a plurality of reservoirs. The modular vehicular cooling system can further include a first plurality of high temperature fluid paths each fluidly coupling one of the plurality of heat sink modules to one of the plurality of reservoirs for transferring a two-phase coolant from the one heat sink module to the coupled one reservoir. The modular vehicular cooling system can also include a second plurality of high temperature fluid paths each fluidly coupling one of the plurality of reservoirs to the heat radiator module for transferring the two-phase coolant from the coupled one reservoir to the heat radiator module. The modular vehicular cooling system can additional include a first plurality of low temperature fluid paths each fluidly coupling the heat radiator module to one of the plurality of reservoirs for transferring the two-phase coolant from the heat radiator module to the coupled one reservoir. The modular vehicular cooling system can include a second plurality of low temperature fluid paths fluidly each fluidly coupling one of the radiators to one of the plurality of heat sink modules, for transferring the two-phase coolant from the coupled one reservoir to the coupled one heat sink module.

The heat radiator module can be configured to cool the two-phase coolant into a substantially liquid form, and wherein the heat radiator module is further configured to be located within a vehicle at a higher elevation than the plurality of reservoirs, such that the two-phase coolant, in substantially liquid form, is moved from the heat radiator module to the plurality of reservoirs. Each of the plurality of heat sink modules can be configured to be thermally coupled to a heat-generating component located within the vehicle at a lower elevation than the heat radiator module and transfer heat from the heat-generating component to heat the two-phase coolant into a substantially gaseous form, and wherein the one heat sink module is configured to be located within the vehicle at lower elevation than the plurality of reservoirs, such that the two-phase coolant, in substantially gaseous form, is moved primarily by force of buoyancy from each of the plurality of heat sink modules to a reservoir of the plurality of reservoirs. Two of the plurality of heat sink modules can be fluidly coupled to one of the plurality of reservoirs such that the two-phase coolant flows from the two heat sink modules to the one reservoir via a fluid current induced by heat from the heat-generating component.

Two of the plurality of reservoirs can be fluidly coupled to the heat radiator module such that the two-phase coolant flows from the two reservoirs to the heat radiator module in a substantially gaseous phase. The modular vehicular cooling system can include a plurality of metering valves each coupled between a reservoir of the plurality of reservoirs and the heat radiator module and a controller configured to adjust each of the plurality of metering valves to individually control flow of the two-phase coolant between each reservoir and the heat radiator module. The modular vehicular cooling system can include a plurality of thermal sensors, each coupled to a heat-generating component thermally coupled to a respective heat sink module, wherein the controller is configured to adjust a metering valve fluidly coupled to the respective heat sink module based on a temperatures value determined from the one of the plurality of thermal sensors coupled to the heat-generating component thermally coupled to the respective heat sink module.

The modular vehicular cooling system can include a pump configured to cause the two-phase coolant to flow between a reservoir of the plurality of reservoirs e and a heat sink module of the plurality of heat sink modules. The modular vehicular cooling system can also include a controller configured to enable the pump to cause the two-phase coolant to flow between the reservoir and the heat sink module when a condition is met and disable the pump from causing the two-phase coolant to flow between the reservoir and the heat sink module when the condition is not met.

In certain embodiments a vehicle is disclosed, including a heat radiator module having an input port and an output port, a heat sink module having an input port and an output port, a high temperature fluid path coupling the output port of the heat sink module to the input port of the heat radiator module, for transferring a two-phase coolant from the heat sink module to the heat radiator module, and a low temperature fluid path coupling the output port of the heat radiator module to the input port of the heat sink module, for transferring the two-phase coolant from the heat radiator module to the heat sink module. The heat radiator module can be configured to cool the two-phase coolant into a substantially liquid form, and wherein the heat radiator module is located within the vehicle at a higher elevation than the heat sink module, such that the two-phase coolant, in substantially liquid form, is moved from the heat radiator module to the heat sink module. The heat sink module can be configured to be thermally coupled to a heat-generating component located within the vehicle at a lower elevation than the heat radiator module and transfer heat from the heat-generating component to heat the two-phase coolant into a substantially gaseous form, and wherein the heat sink module is configured to be located within the vehicle at lower elevation than the heat radiator module, such that the two-phase coolant, in substantially gaseous form, is moved primarily by force of buoyancy from the heat sink module to the heat radiator module.

The heat radiator module can be thermally coupled to a passenger compartment of the vehicle wherein heat emitted from the heat radiator module can be transferred to passengers within the passenger compartment. The vehicle can further include a pump configured to cause the two-phase coolant to flow between the heat radiator module and the heat sink module and a controller configured. The controller can be configured to enable the pump to cause the two-phase coolant to flow between the heat radiator module and the heat sink module when a condition is met; and disable the pump from causing the two-phase coolant to flow between the heat radiator module and the heat sink module when the condition is not met.

Disclosed are techniques for implementing a battery module. The battery module may include a cooling plate, the cooling plate having an input port for receiving a coolant in a cooled state, the cooling plate having an output port for outputting the coolant in a heated state. The battery module may also include a two dimensional array of elongated battery cells. The cooling plate can comprise at least one substantially planar exterior cooling surface in physical contact with an axial face of each elongated battery cell in the two dimensional array of elongated battery cells. The at least one substantially planar exterior cooling surface can be sized to accommodate axial faces of a plurality of the elongated battery cells along a first dimension and accommodate axial faces of a plurality of the elongated battery cells along a second dimension. The cooling plate can define one or more internal fluid channels fluidly coupling the input port and the output port. The one or more internal fluid channels can be configured to provide thermal coupling between coolant flowing through the one or more internal fluid channels and the axial faces of the elongated battery cells, such that as the coolant flows from the input port to the output port, the coolant is heated by thermal energy emanating from the axial faces of the elongated battery cells.

Each of the elongated battery cells can be configured to emanate thermal energy from the axial face of the elongated battery cell at a higher thermal density than a sidewall of the elongated battery cell. Each of the elongated battery cells can be configured to emanate more thermal energy from an axial face of the elongated battery cell than a sidewall of the elongated battery cell. Each of the elongated battery cells can include an anode material, a cathode material, and an electrolyte material, wherein the electrolyte material is disposed between the anode material and the cathode material along a direction between two axial faces of the elongated battery cell. The cathode material or the anode material can have a higher thermal conductivity than the electrolyte material. The battery module can further comprise an attachment apparatus configured to apply pressure between the axial faces of the elongated battery cells and the cooling plate.

In certain embodiments, a heat sink module can include a cooling plate having an input port for receiving a coolant in a cooled state, the cooling plate having an output port for outputting the coolant in a heated state. The cooling plate can comprise at least one substantially planar exterior cooling surface for making physical contact with an axial face of each elongated battery cell in a two dimensional array of elongated battery cells. The at least one substantially planar exterior cooling surface can be sized to accommodate axial faces of a plurality of the elongated battery cells along a first dimension and accommodate axial faces of a plurality of the elongated battery cells along a second dimension. The cooling plate can define one or more internal fluid channels fluidly coupling the input port and the output port. The one or more internal fluid channels are configured to provide thermal coupling between coolant flowing through the one or more internal fluid channels and the axial faces of the elongated battery cells, such that as the coolant flows from the input port to the output port, the coolant is heated by thermal energy emanating from the axial faces of the elongated battery cells.

The elongated battery cells can be cylindrical battery cells. The cooling plate can define a plurality of cylindrical indentations each configured to be in physical contact with a corresponding axial face of a battery cell of the plurality of cylindrical battery cells. Each of the elongated battery cells can be configured to emanate thermal energy from the axial face of the elongated battery cell at a higher thermal density than a sidewall of the elongated battery cell.

The cooling plate can define one or more micro channels within the one or more internal fluid channels, the one or more micro channels defined to enlarge an interface surface area between the cooling plate and coolant flowing through the internal fluid channels. The cooling plate can define one or more micro pins within the one or more internal fluid channels, the one or more micro pins defined to enlarge an interface surface area between the cooling plate and coolant flowing through the internal fluid channels. The cooling plate can define a gas collection chamber to collect, from two of the one or more internal fluid channels, gaseous phase coolant that changes to a gaseous phase by being heated by thermal energy emanating from an axial face prior to exiting the cooling plate via the output port.

The heat sink module can include an attachment apparatus configured to apply pressure between the axial faces of the elongated battery cells and the cooling plate. The cooling plate can further define a low pressure area and a high pressure area within one of the one or more internal fluid channels in proximity to an axial face, wherein fluid flowing from the input port to the output port flows from the high pressure area to the low pressure area. The cooling plate further include one or more integral electrical contact points configured to electrically couple to a corresponding electrode of an axial face of an elongated battery when the axial face is in physical contact with the cooling plate. The cooling plate can define the one or more internal fluid channels in proximity to an axial face and the one or more integral electrical contact points are proximate to the same axial face of the elongated battery that is in proximity to the defined one or more internal fluid channels.

In certain embodiments, a method can include receiving, at an input port of a cooling plate, a coolant in a cooled state and outputting, at an output port of the cooling plate, the coolant in a heated state. The cooling plate can comprise at least one substantially planar exterior cooling surface for making physical contact with an axial face of each one of a two dimensional array of elongated battery cells. The at least one substantially planar exterior cooling surface can be sized to accommodate axial faces of a plurality of the elongated battery cells along a first dimension and accommodate axial faces of a plurality of the elongated battery cells along a second dimension. The cooling plate can define one or more internal fluid channels fluidly coupling the input port and the output port. The one or more internal fluid channels can be configured to provide thermal coupling between coolant flowing through the one or more internal fluid channels and the axial faces of the elongated battery cells, such that as the coolant flows from the input port to the output port, the coolant is heated by thermal energy emanating from the axial faces of the elongated battery cells.

Each of the elongated battery cells can be configured to emanate thermal energy from the axial face of the elongated battery cell at a higher thermal density than a sidewall of the elongated battery cell. Each of the elongated battery cells can include an anode material electrically, a cathode material, and an electrolyte material, wherein the electrolyte material is disposed between the anode material and the cathode material along a direction between two axial faces of the elongated battery cell.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
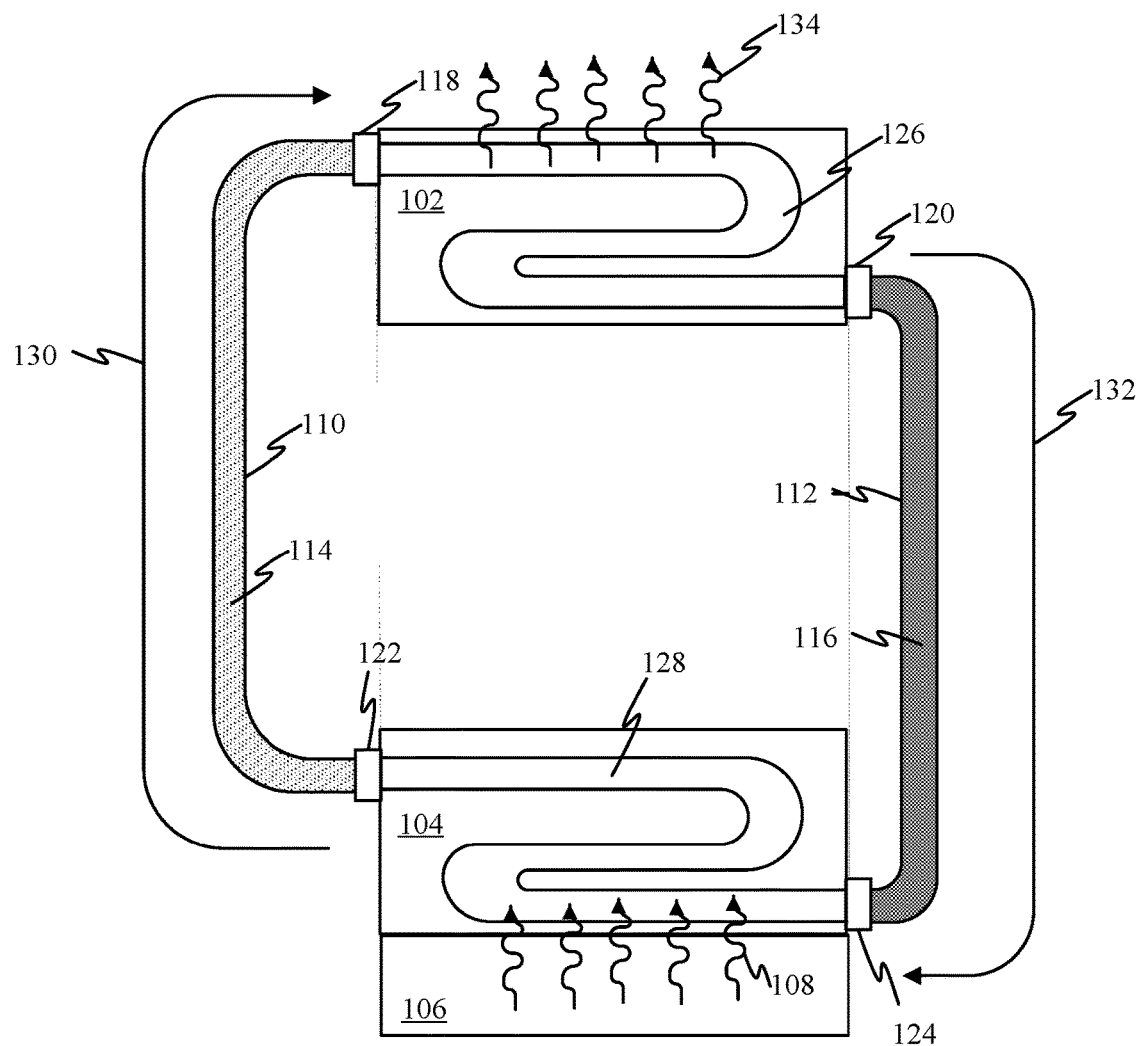
FIG. 1 illustrates a convection driven vehicle cooling system according to certain embodiments.

This description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Cooling systems for vehicles have generally been developed and optimized for use with internal combustion engines, given the prevalence of such propulsion systems for vehicles. For internal combustion engines, many accessories (such as coolant/coolant pumps) are driven directly from a crankshaft. For example, it is not uncommon for a coolant pump in a vehicle to be belt driven directly from the crankshaft. As the crankshaft rotates as a result of fuel being combusted within combustion chamber(s), a coolant pump can be driven by the same forces used to propel the vehicle. The coolant pump can be operable to circulate coolant through a cooling system of the internal combustion engine, including circulating fluid coolant between a radiator and an engine block.

Cooling systems for internal combustion engines can include internal flow channels within engine heads and or the engine block itself. Coolant can flow through these channels. As the coolant flows through the internal flow channels, thermal energy resulting from burning of fuel in the internal combustion engine can be coupled from the engine block or headers to the coolant. The coolant can then be circulated from the engine block, through one or more flow paths, to a radiator. The radiator can be configured to dissipate heat from the coolant. For example, a radiator can include many internal flow channels each thermally coupled to metal fins (or other thermally conductive material). The fins can be operable to provide a relatively large surface area for interface with a secondary fluid interface. For example, the secondary fluid interface can be to air traveling across an exterior of the vehicle. It is therefore not uncommon to locate radiators at the front of an automobile such that the radiator is in the path of air through which the vehicle travels. As disclosed, a pump can be used to circulate the coolant between the engine and the radiator. Cooling system can include other ancillary features such as: additional flow paths, overflow tanks, thermostats, etc.

Alternative propulsion systems to internal combustion propulsion systems, such as electric drive systems, present new challenges for cooling systems that may not be addressed by traditional vehicle cooling systems. Electric drive systems can include hybrid, pure electric, and other systems. In a pure electric system, vehicle batteries are used to store electric charge to drive an electric motor. In various types of electric vehicles, the battery module can be a major contributor to thermal output of the propulsion system. Furthermore, certain battery chemistries operate at higher efficiency in certain temperature ranges. Thermal runaway is also a concern for certain battery technologies and can result in damage to a vehicle or danger to passengers of a vehicle. Proper thermal control of batteries is therefore an important consideration for safe and efficient operation of vehicles involving electric propulsion (and other alternative propulsion systems).

The efficiency of cooling systems can be more important a consideration in electric vehicles than traditional vehicles, e.g., a vehicle with an internal combustion engine. For example, internal combustion engines can drive a coolant pump directly from a crankshaft, taking advantage of energy produced through the combustion of fuel. By contrast, an electric vehicle might utilize an electric motor to drive a pump to circulate coolant. The electrical energy used to drive the pump may be derived either directly or indirectly from the same battery module that is configured to power an electric motor for vehicle propulsion. Therefore, the use of an electric coolant pump can have a real impact on the range and performance of the electric vehicle. The more efficient the cooling system, the less electrical energy that system consumes, and correspondingly, the more electrical energy that may be available for extending the range and performance of the electric vehicle.

Disclosed herein are techniques for implementing relatively high-efficiency cooling systems for cooling battery cells in electric vehicles. In certain embodiments, cooling systems can operate to circulate coolant without the use of a coolant pump. In certain embodiments, high-efficiency cooling plates for use with elongated battery cells are disclosed. Cooling systems can benefit from features from the disclosed techniques individually or in any combination. Embodiments disclosed are non-limiting and can be combined in various manners to improve the efficiency of cooling systems and/or to adapt cooling systems in various manners, especially for use with electric vehicle battery modules.

FIG. 1 illustrates a functional diagram of a cooling system 100. Cooling system 100 includes a heat radiator module 102 and a heat sink module 104. Heat sink module 104 can be thermally coupled to a battery module 106. As disclosed herein, battery module 106 can be a component of a vehicle propulsion system. For example, battery module 106 can be operable to store electrical energy for use to propel a vehicle with an electric motor. As electrical energy is drawn from battery module 106, thermal energy can be generated by battery cells or other components of battery module 106. As a thermal energy is generated, the temperature of components of battery module 106 can increase. Cooling system 100 can be operable to regulate and control the temperature of components of battery module 106 to improve the efficiency of battery module 106 and/or prevent thermal runaway.

Battery module 106 can be a heat-generating component of a vehicle. Alternatively or additionally, the heat-generating component can be an electric motor, inverter, transmission, converter, voltage regulator, brake (or regenerative brake) assembly, electrical resistance path, or other component of a vehicle. The example of a battery module is not intended to be limiting but, for clarity, will be used throughout this specification as an embodiment of a heat-generating component. Heat sink module 104 can comprise, for example, a cooling plate to be thermally coupled to a battery cell. The cooling plate can be physically coupled to the exterior of the battery cell. Alternatively, heat sink module 104 can comprise, for example, a chamber with coolant flowing therethrough. A battery cell can be disposed within the chamber such that the coolant has direct physical contact with the battery cell.

As battery module 106 emits thermal energy 108, coolant flowing through heat sink module 104 carries away thermal energy 108 in the form of heated coolant. Cooling system 100 can transport the heated coolant to heat radiator module 102 wherein thermal energy 134 is dissipated and vented via heat radiator module 102. Cooling system 100 can be a closed loop system wherein a set amount of coolant is recirculated. If the cooling system is in equilibrium, then thermal energy 108 can equal thermal energy 134. Thus, coolant within the cooling system 100 can be used as a thermal transport medium to move heat away from battery module 106 and dissipate the heat via heat radiator module 102.

As illustrated, thermal energy 108 from battery module 106 can be thermally coupled into an internal flow channel 128 of heat sink module 104. Fluid flowing through this internal flow channel 128 can be heated by thermal energy 108. One form of coolant that can be used is a two-phase coolant. A two-phase coolant can be operable to change phases as it is heated. For example, a particular coolant can be selected having a boiling point similar to an expected temperature that the coolant reaches when heated by battery module 106. The two phases that the coolant may transition between can be a liquid phase and a gaseous phase. As coolant is heated within internal flow channel 128 by battery module 106, it can change phase from liquid to gas. It should be understood that not all coolants may change phase. Furthermore, only a portion of two-phase coolant within the system may change phase due to heating effects of battery module 106 (e.g., coolant within internal flow channel 128 can be a mixture of gas and liquid coolant).

The two phases (gas and liquid) of the coolant can share the same flow channels. If so, then the gaseous phase of the coolant can move upward by forces of buoyancy. That is to say, the gaseous phase of the coolant will be less dense than the liquid phase of the coolant. Therefore, the gaseous-phase coolant will rise above the liquid-phase coolant, which is pulled by the force of gravity downward. Alternatively, a single phase coolant can be used such that is heated and thus becomes less dense than cooler coolant wherein the less dense coolant rises above the cooler, denser coolant.

As coolant within heat sink module 104 is heated and becomes less dense, it may exit heat sink module via exit port 122. If exit port 122 of heat sink module 104 is at a higher elevation than input port 124, advantage can be taken of a natural flow of the coolant upwards due to forces of buoyancy as the coolant is heated. Exit port 122 can be fluidly coupled to input port 118 of heat radiator module 102 via fluid flow path 110. The term "fluidly couple," as used herein, means to couple two or more entities such that a fluid can be transferred between the two or more entities. If heat radiator module 102 is positioned at a higher elevation than heat sink module 104, then heated and/or gaseous coolant can naturally flow upwards from heat sink module 104 to heat radiator module 102 through the forces of buoyancy, as indicated by arrow 130. After the coolant enters heat radiator module, it can flow through internal fluid channels 126 of heat radiator module 102. Heat radiator module 102 can be configured to thermally interface the coolant with an external medium. For example, the external medium can be air external to the vehicle. Heat from the coolant can be thermally emitted 134 or otherwise transferred from the coolant to the external medium.

As coolant is cooled within heat radiator module 102, the coolant can become more dense. For example, a two-phase coolant can be cooled from a gaseous phase to a liquid phase. As the coolant cools, the denser and cooler portions can be drawn downwards by forces of gravity to exit port 120 via fluid channels 126. If exit port 120 of heat radiator module 102 is at a lower elevation than input port 118, advantage can be taken of a natural flow of the coolant downwards due to forces of gravity as it cools. Exit port 120 of heat radiator module 102 can be fluidly coupled to input port 124 of heat sink module 104 via flow path 112. The direction of coolant flow is indicated by arrow 132. As disclosed, if heat sink module 104 is a placed at a lower elevation than heat radiator module 102, then cooled and/or liquid coolant can naturally flow through forces of gravity from heat radiator module 102 to heat sink module 104. As illustrated, coolant 114 within flow path 110 is less dense than coolant 116 within flow path 112.

Mechanical advantages of convection currents caused by heating and cooling of coolant can thus be taken advantage of to move fluid through cooling system 100 without use of a coolant or other pump. By circulating coolant within cooling system 100 without use of a pump, parasitic losses of a pump can be avoided, increasing the range or performance of an electric vehicle while still allowing battery module 106 to be thermally regulated.

According to various embodiments, placement of battery module 106 at a relatively low elevation in a vehicle serves the dual purposes of (1) facilitating gravity-based coolant flow in a pump-less battery cooling system for an electric vehicle and (2) improving the weight distribution and the center of gravity of the vehicle. For example, battery module 106 can include many relatively heavy components, such as battery cells. Furthermore, battery cells and components can be distributed within battery module 106 in various ways. Therefore, one configuration of battery module 106 can be relatively planar in order to be located within or near a floor of the vehicle, for example. As such, battery module 106 can be located at a relatively low elevation within the vehicle to improve weight distribution and center of gravity. Advantageously, the placement of battery module 106, cooled by heat sink module 104, at the relatively low elevation in the vehicle, along with placement of heat radiator module 102 at a relatively higher position in the vehicle (e.g., at a higher elevation at the front of the vehicle or toward the rear of the vehicle) promotes the movement of coolant by natural forces of gravity and buoyancy within cooling system 100.

Figure 2:
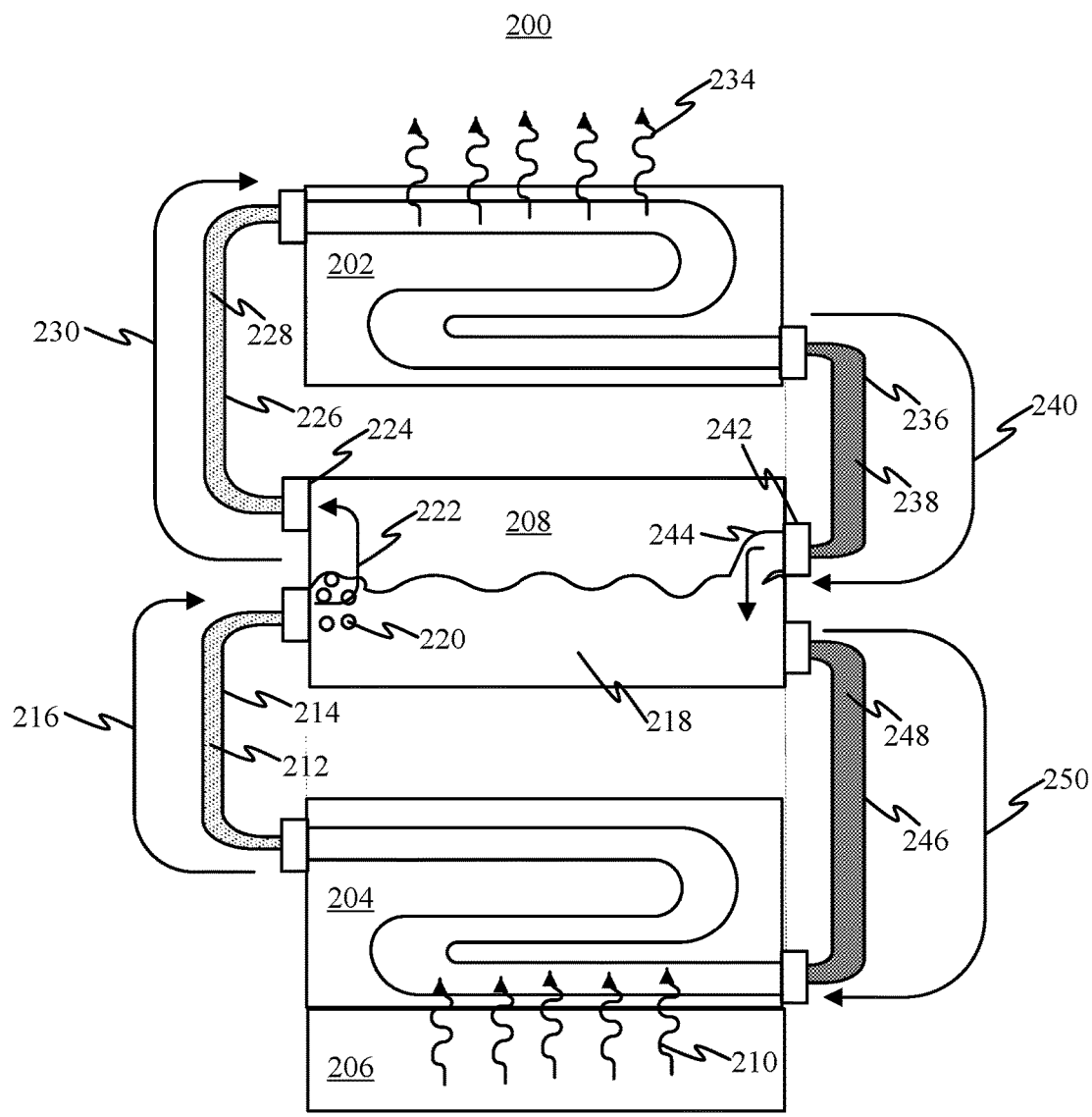
FIG. 2 illustrates a convection driven vehicle cooling system with a reservoir according to certain embodiments.

FIG. 2 illustrates a particular embodiment of a cooling system 200. Cooling system 200 includes a heat radiator module 202, heat sink module 204, and battery module 206 which can be equated to equivalent structures of FIGS. 1 (102, 104, and 106 respectively). Cooling system 200 also includes reservoir 208. Like cooling system 100, thermal energy 210 is transferred from battery module 206 to the coolant within internal flow channels of heat sink module 204. The coolant can be heated and possibly change phase. After the coolant is heated, it can flow via buoyancy forces in the direction indicated by arrow 216, through flow path 214. However, instead of flowing directly to a heat sink module of cooling system 100, the coolant can flow to reservoir 208. As disclosed, coolant 212 within flow path 214 can be a mixture of gaseous phase and liquid phase coolant. As such mixed phase coolant enters reservoir 208, gaseous phase coolant can float 220 upwards and separate from liquid phase coolant 218. Liquid phase coolant can flow out of reservoir 208 to heat sink module 204 in a direction indicated by arrow 250 through fluid flow path 246.

Gaseous phase coolant 220 can float through forces of buoyancy out of exit port 224 of reservoir 208 as indicated by arrow 222. Gaseous phase coolant can flow in a direction indicated by arrow 230 through flow path 226 to heat radiator module 202. As thermal energy 234 is emitted or otherwise transferred from the coolant within heat radiator module 202, the coolant can condense and thus flow in the direction indicated by arrow 240 through flow path 236 to reservoir 208. Reservoir 208 can be operable to provide a substantially liquid coolant circulation path between heat sink module 204 and reservoir 208. By providing this substantially liquid coolant circulation path, coolant circulating between heat sink module and reservoir 208 can consistently flow between the two with less interference from gas bubbles. Thus, the coolant fluid flow can be more consistent. Furthermore, coolant systems with one or more reservoirs fluidly coupled between heat sink modules and heat radiator modules can provide certain packaging advantages as will become evident from the disclosure.

Reservoir 208 can be configured with exit port 224 at a higher elevation than input port 242. As described herein, such a configuration can allow gaseous phase coolant to flow upwards through the force of buoyancy. As illustrated, gaseous phase coolant 220 can flow out of reservoir 208 through the path indicated by arrow 222. Liquid phase coolant 244 can flow into reservoir 208 from heat radiator module 202. Thus coolant 228 within flow path 226 can be in a substantially gaseous phase. Coolant 212 within flow path 214 can be a mixture of gaseous and liquid phase coolant. Coolant 248 within fluid flow path 246 can be in a substantially liquid phase. Coolant 238 within flow path 236 can be a mixture of liquid and gaseous phase coolant.

Figure 3:
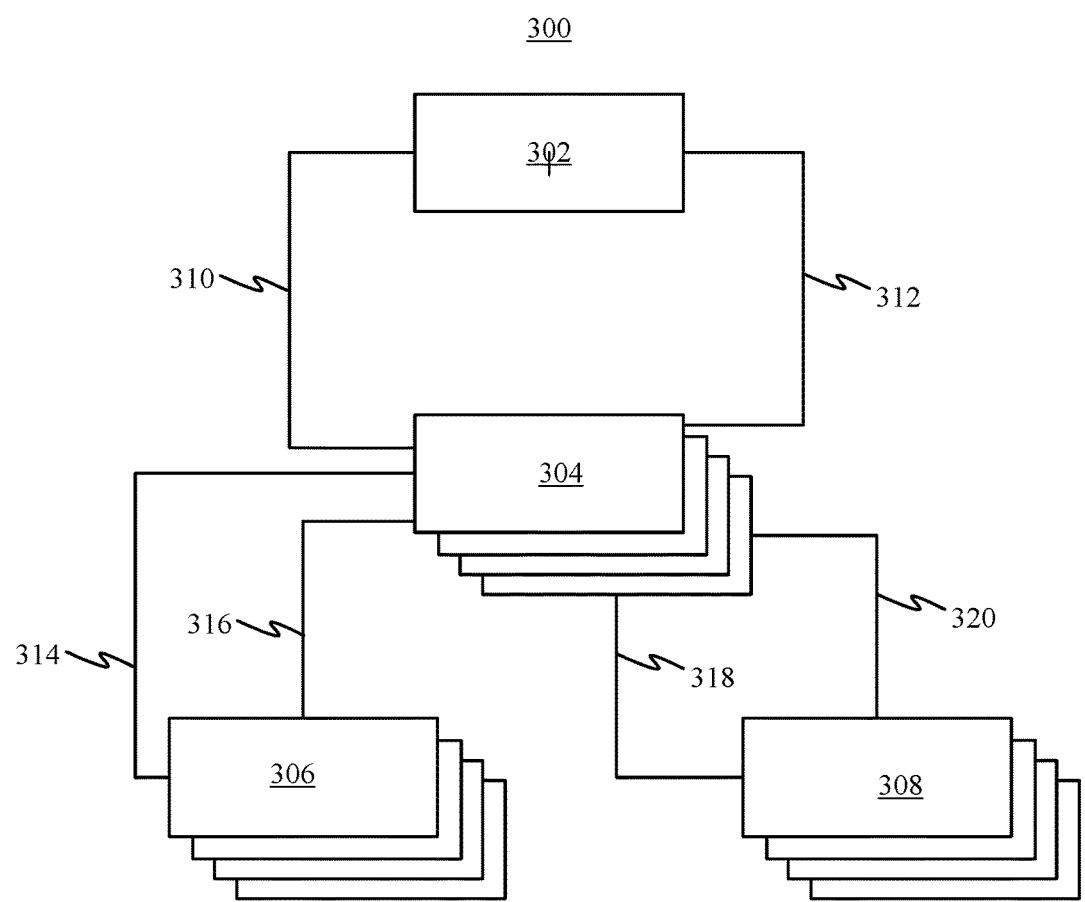
FIG. 3 illustrates configurations of convection driven cooling system components according to certain embodiments.

FIG. 3 illustrates various combinations of components of a cooling system 300. Cooling system 300 can include heat radiator module 302 which can be similar to the radiator module 202. Cooling system 300 can also include reservoir(s) 304 that can each be similar to reservoir 208. Illustrated are also two groups of heat sink modules 306 and 308. Each of the heat sink modules of the groups 306 and 308 can be thermally coupled to a battery pack module (not shown). As illustrated, a plurality of reservoirs 304 can be fluidly coupled to a singular heat radiator module 302 via flow paths 310 and 312. Furthermore, a plurality of heat sink modules 306 can be fluidly coupled to a plurality of reservoirs 304 via flow paths 314 and 316. In certain embodiments, a group of heat sink modules can be coupled to a single reservoir. For example, heat sink modules 308 can be fluidly coupled via flow paths 318 and 320 to a different reservoir of reservoir(s) 304 than heat sink modules 306. The two different reservoirs can be fluidly coupled to the same heat radiator module 302.

Figure 4:
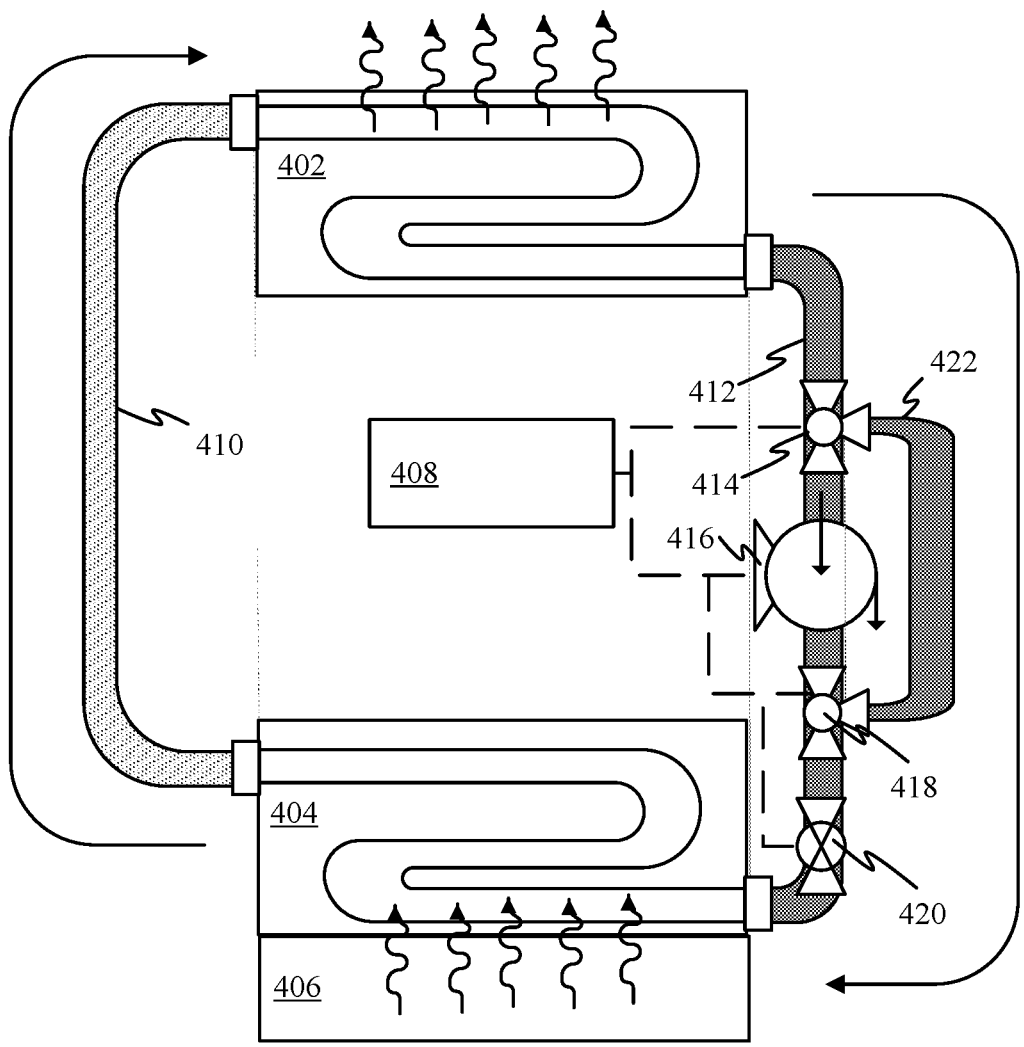
FIG. 4 illustrates selectable pump or convection driven cooling system components according to certain embodiments.

FIG. 4 illustrates another embodiment of a cooling system 400. Cooling system 400 includes heat radiator module 402, heat sink module 404, and battery module 406. Similar to cooling system 100, battery module 406 can transfer thermal energy into coolant within heat sink module 404 that is thermally coupled to battery module 406. As the coolant is heated, it can flow through flow path 410 to heat radiator module 402 wherein thermal energy can be dissipated and the coolant cooled.

Cooling system 400, includes a coolant pump 416 and valves 414 and 418 fluidly coupled to flow path 412. Cooling system 400 can be operable to circulate coolant either through convection flow from heating and cooling coolant or via forced recirculation via pump 416. Controller 408 is coupled to each of pump 416, valve 414, and valve 418. Valves 414 and 418 can be configured to divert coolant flowing through flow path 412 through flow path 422, bypassing pump 416.

Controller 408 can be configured to selectively operate valves 414 and 418 and pump 416 according to certain variables. For example, a temperature of battery pack and/or coolants within cooling system 400 can be used to determine whether to activate pump 416 and or valves 414 and 418. Pump 416 can be activated to induce a current flow that is then maintained via convection currents. Pump 416 can also be activated to provide more flow than would be available through only the use of convection. Controller 408 can be coupled to various sensors (not shown) to determine whether pump 416 and/or valves 414 and 418 are to be activated. These sensors can be operable to detect a temperature or a pressure reading that is internal to cooling system 400 or external to a vehicle to which cooling system 400 is coupled, for example. Controller 408 can also receive temperature and pressure information from other systems. For example, temperature and/or pressure information can be provided by a communication system that is communally coupled to a weather server and/or crowd sources such information.

Cooling system 400 can also include metering valve 420. Metering valve 420 can be operable to adjust an amount of flow of coolant through cooling system 400. Controller 408 can be communicatively coupled to metering valve 420 and can adjust flow through the system according to various conditions. For example, metering valve 420 can be set to restrict flow of current to induce an increased pressure differential between coolant in flow path 410 and coolant in flow path 412. This increased pressure differential can lead to increased coolant flow through cooling system 400. As battery module 406 provides more thermal energy to the coolant within cooling system 400, convection flow of the coolant within cooling system 400 can increase. Thus, metering valve 420 can then impede flow through cooling system 400 as a pressure differential between flow path 410 and 412 can be sufficiently induced solely via convection effects. Controller 408 can be coupled to thermal or other sensors within cooling system 400. Controller 408 can also use timing or other variables to determine states of valves 414, 418, 420, and pump 416 to optimize coolant flow through cooling system 400 to maximize cooling efficiencies of the system.

Pump 416 can be a centrifugal, rotary, reciprocating, or other type of pump. In certain embodiments, pump 416 is a peristaltic pump. A peristaltic pump may negate the need to use valves 414 and 418. For example, a peristaltic, or other, pump can be configured to minimally impact flow of coolant through flow path 412 when not actively pumping coolant through the system.

Figure 5:
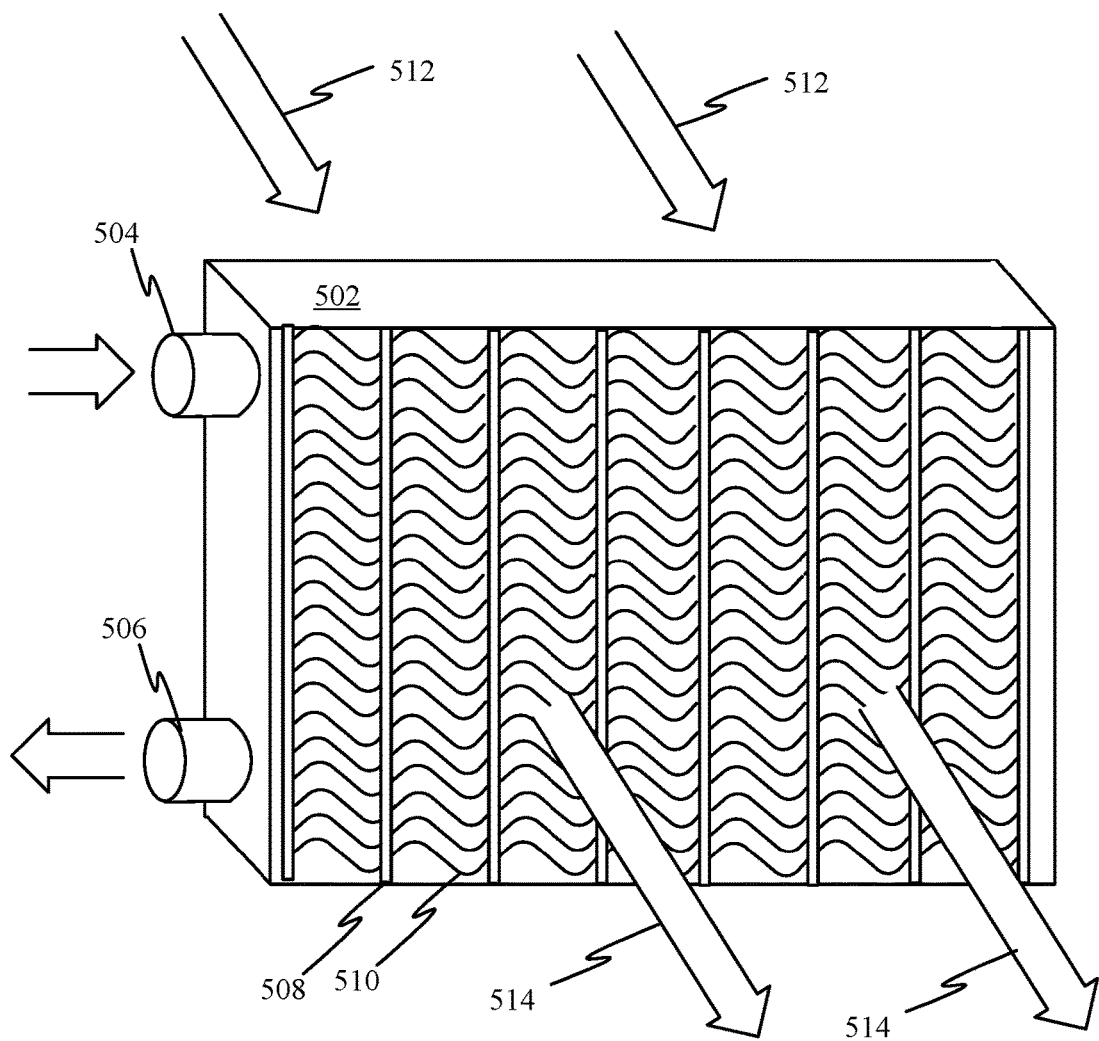
FIG. 5 illustrates a heat radiator module according to certain embodiments.

FIG. 5 illustrates a perspective view of an example heat radiator module 502. Heat radiator module 502 can be similar to heat radiator module 402. Heat radiator module 502 includes an input port 504 and output port 506 for receiving and outputting coolant respectively. Heat rear module 502 can include a plurality of internal flow channels 508 that are each fluidly coupled to input port 504 and output port 506. As illustrated, each of internal flow channels 508 can be configured to form a plurality of parallel flow channels between the input port and the output port. Each of the internal flow channels 508 can internally flow a portion of coolant flowing into input port 504 or out of output port 506. Thus, coolant flowing into input port 504 can be distributed across the plurality of internal flow channels 508 before exiting out of output port 506.

Each of the internal flow channels 508 can be thermally coupled to one or more heat radiating features 510. Heat radiating features 510 can be, for example, metal fins that are coupled to each of internal flow channels 508. Heat radiator module 502 can be configured such that airflow 512 passing through heat radiator module 502 traverses heat radiating features 510. As airflow 512 passes through heat radiator module 502, heat can be transferred from the coolant inside of internal flow channels 508, through heat radiating features 510, to airflow 512. Thus, airflow 512 can be cooler than airflow 514 that has already traversed heat radiator module 502. Although not shown, heat radiator module 502 can be coupled to a fan or other airflow inducing device.

Figure 6:
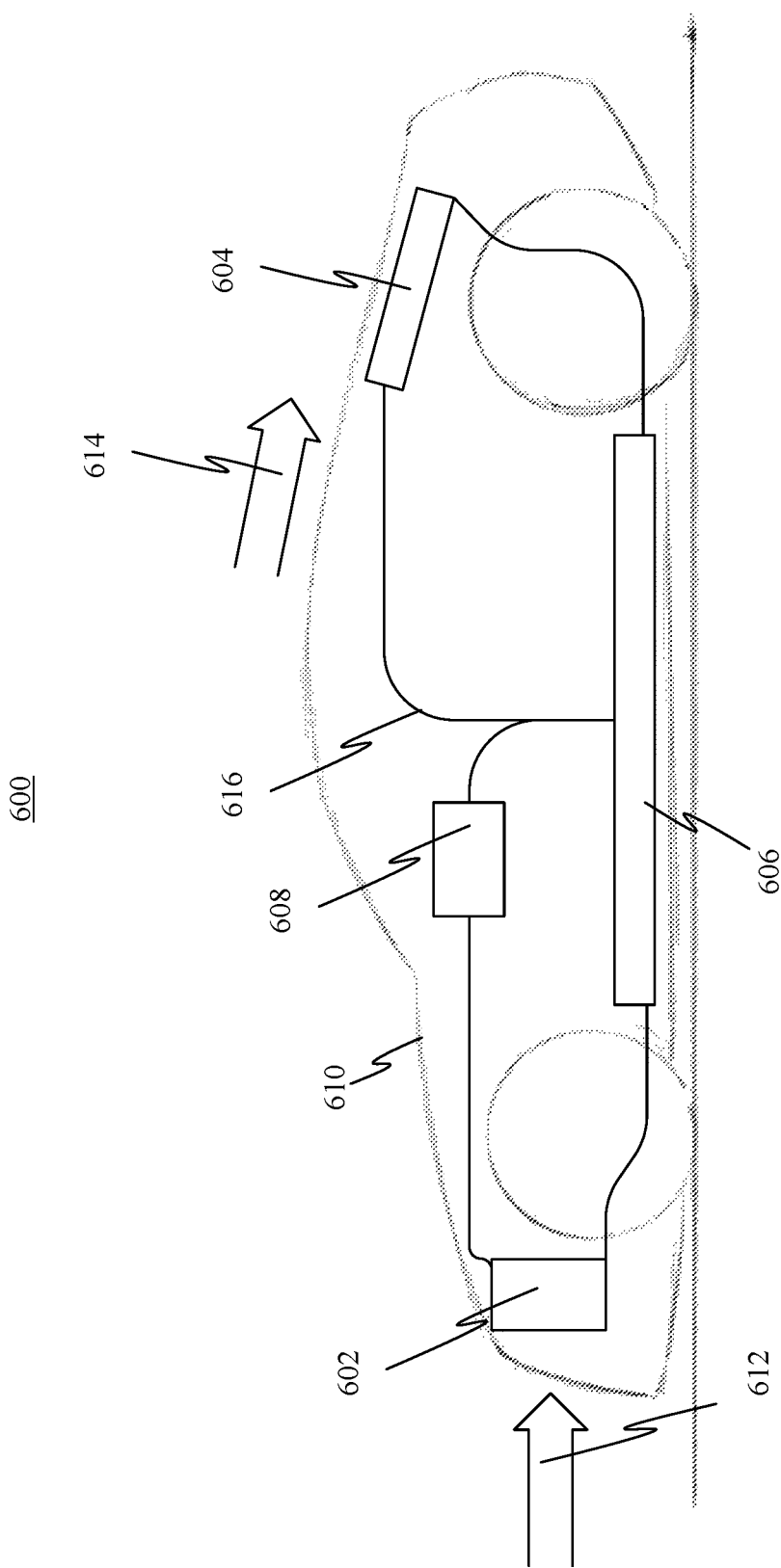
FIG. 6 illustrates a side profile view of a vehicle with cooling system components according to certain embodiments.

FIG. 6 illustrates a side profile of a vehicle 600 is illustrated to provide various visual representations of locations of heat radiator modules, heat exchange modules, and other features of cooling systems disclosed herein. For example, heat sink and battery module 606 is illustrated as being located near the floor or bottom of vehicle 600. As disclosed herein, battery cells can be arranged into a battery module operable to be contained within or near the floor of the vehicle. As illustrated, when heat sink and battery module 606 is thus located, it can be at a relatively low elevation when implemented within a vehicle 600, as illustrated. Also illustrated are heat radiator modules 602 and 604. Heat radiator module 602 is located at the front of vehicle 600, such that airflow 612, through which vehicle 600 may be moving, can be directly incident upon heat radiator module 602. Heat radiator modules 602 and 604 can be located at higher elevations than heat sink and battery module 606 to enable gravity-induced flow of coolant between the modules.

Heat radiator module 604 is illustrated in another possible location where airflow 614 traversing across the exterior 610 of vehicle 600 can have contact with heat radiator module 604. As airflows 612 and 614 traverse heat radiator modules 602 and 604 respectively, heat can be transferred to airflows 612 and 614. Heat radiator modules 602 and 604 can be strategically located to alter aerodynamic effects of airflow incident upon vehicle 600. For example, airflow 614 can be directed over heat radiator module 604 and induce downforce upon the rear of vehicle 600 to improve stability of vehicle 600 at speed. Additionally, heat radiator modules 602 and 604 can be fluidly coupled to heat sink and battery module 606 through various fluid flow paths 616.

Also illustrated is a third heat radiator module 608 that can be located, for example, inside a passenger compartment of vehicle 600. Heat radiator module 608 can be configured to emit thermal energy for various useful purposes. For example, thermal energy from a radiator module within vehicle 600 can be used to heat a seat of a passenger, floorboards, a steering wheel, etc. In certain embodiments, heat from a heat exchange module can be used to defrost snow or ice from various areas of vehicle 600, including the exterior 610 of vehicle 600. In still other embodiments, heat energy obtained from a heat radiator module can be used to heat electrical or other components of vehicle 600. For example, a secondary battery pack can be brought up to operating temperature using heat thus obtained. Vehicle 600 can include various valves (not shown) to divert coolant as needed between various heat radiator modules of vehicle 600. Furthermore, any number of heat radiator modules can be used in conjunction with the cooling systems disclosed herein. In some embodiments, a heat radiator module can be formed integral with another component of vehicle 600. For example, a hood or spoiler of the vehicle can from a heat radiator module.

Figure 7:
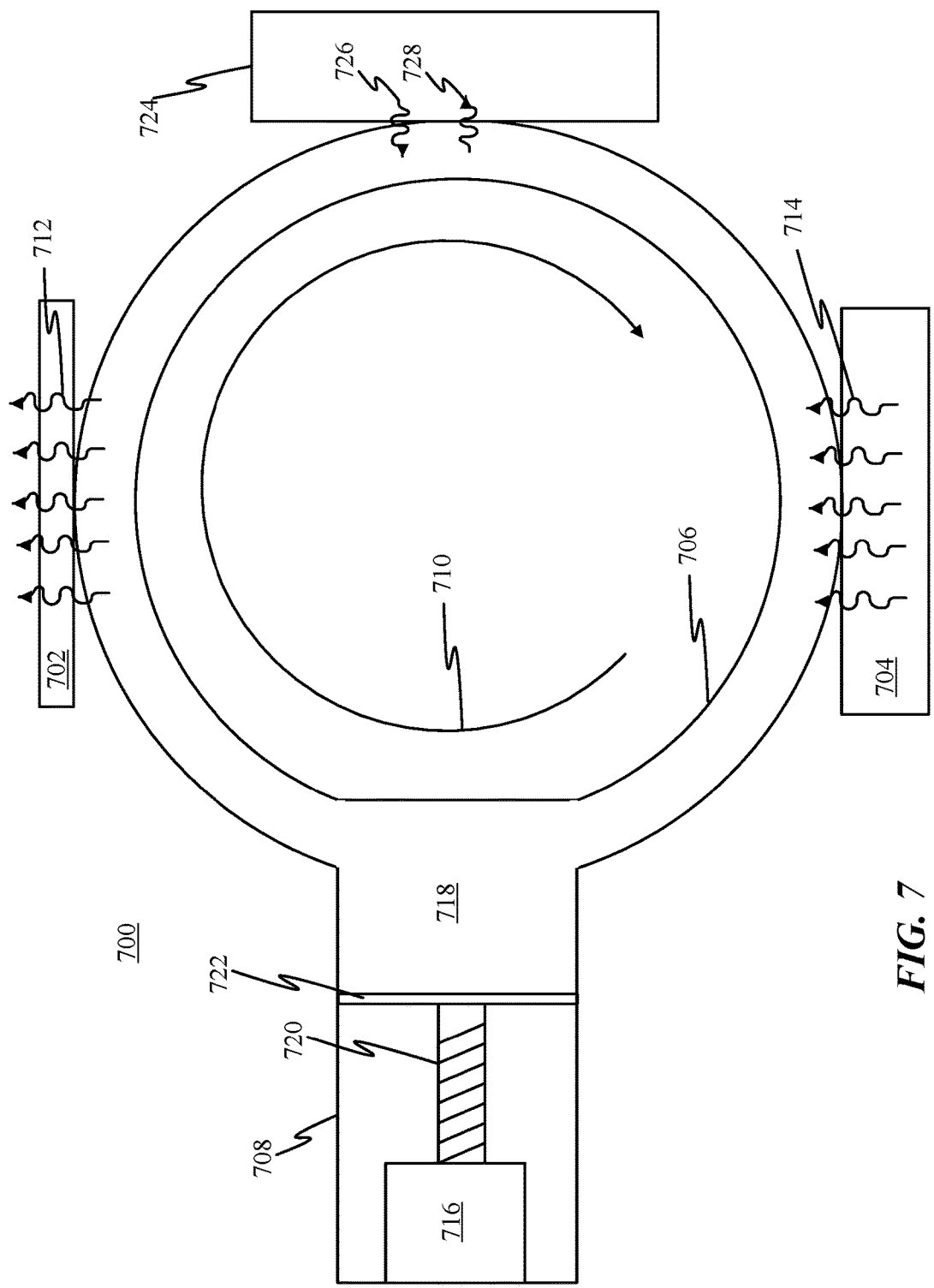
FIG. 7 illustrates cooling system with variable pressure regulation according to certain embodiments.

FIG. 7 illustrates a logical view of cooling system 700 for implementing various features of cooling systems disclosed herein. Cooling system 700 includes a heat radiator module 702 and a heat sink module 704. As disclosed herein, heat sink module 704 can be thermally coupled to a battery module (not shown). Cooling system 700 can include a closed-loop cooling path 706. That is to say, a set amount of coolant can be contained within closed-loop cooling path 706 such that no coolant is vented to or received from the exterior environment. Thus, closed-loop cooling path 706 can be a substantially sealed system. As disclosed herein, as thermal energy enters 714 cooling system 700 and exits 712 cooling system 700, coolant contained within cooling system 700 can be induced to flow through closed cooling path 706, forming a convection current flow. A two-phase coolant may also be used, as discussed previously.

As disclosed, a phase change of the two-phase coolant from liquid to gas can initiate the convection flow current in direction 710 through the force of buoyancy upon the gaseous phase coolant. As pressure increases and remaining environmental variables remain constant, the boiling point of a fluid will increase. Thus, by either increasing or decreasing pressure within closed-loop cooling path 706, the boiling point of coolant contained therein can be altered. By lowering the boiling point, two-phase coolant can be made to boil more easily and therefore be more likely to induce convection current flow within closed-loop cooling path 706. Additionally, effects of atmospheric pressure can be compensated for. For example, if a vehicle containing a cooling system were to traverse a mountain, then it may be beneficial to adjust the internal pressure of cooling system 700 to compensate for changes in atmospheric pressure, thus maintaining a relatively consistent boiling point and predictable flow of coolant.

Illustrated is a pressure compensation module 708 that can be configured to alter the pressure within closed-loop cooling path 706. Pressure compensation module 708 includes an actuator 716, a screw 720, and an adjustable plate 722. Actuator 716 can be communicatively coupled to a controller (not shown). Depending on various variables, the controller can command actuator 716 to move adjustable plate 722. Adjustable plate 722 can form a fluid tight seal with walls of pressure compensation module 708. Thus, by moving adjustable plate 722 either to the right or to the left in FIG. 7, area 718 can be expanded or compacted. Area 718 can be in fluid communication with, and form a part of, closed loop cooling path 706. Thus by moving adjustable plate 722 to the right, pressure within closed-loop cooling path 706 can be increased. By moving adjustable plate 722 to the left, pressure within closed-loop cooling path 706 can be decreased. Adjustment of the pressure within closed-loop cooling path 706 can be based on changes in atmospheric pressure, target flow rates of coolant contained within, temperatures of various components of cooling system 700, and/or other factors. This information can be gathered directly through sensors or provided through external sources. For example, a weather service can provide atmospheric pressure data.

Illustrated is a thermal modulator 724 that can be thermally coupled to coolant flowing from heat radiator module to heat sink module 714. Thermal modulator 247 can be a heat exchanger or other device configured to add 726 or remove 728 thermal energy from the coolant. The heat radiator module can supplement cooling system 700 by, for example, heating coolant flowing within coolant system when ambient temperatures of a vehicle are relatively low. For example, if a vehicle were left out in the cold during wintertime. Heating the coolant can aid in regulating temperatures of vehicle components, such as battery cells, to bring them into ideal operating temperatures more quickly. Thermal modulator 724 can also be operable to cool coolant to, for example, supplement cooling system 700 when ambient temperatures are relatively high. Thermal modulator 724 can aid in formation of a convection current of coolant within cooling system 700.

Figure 8:
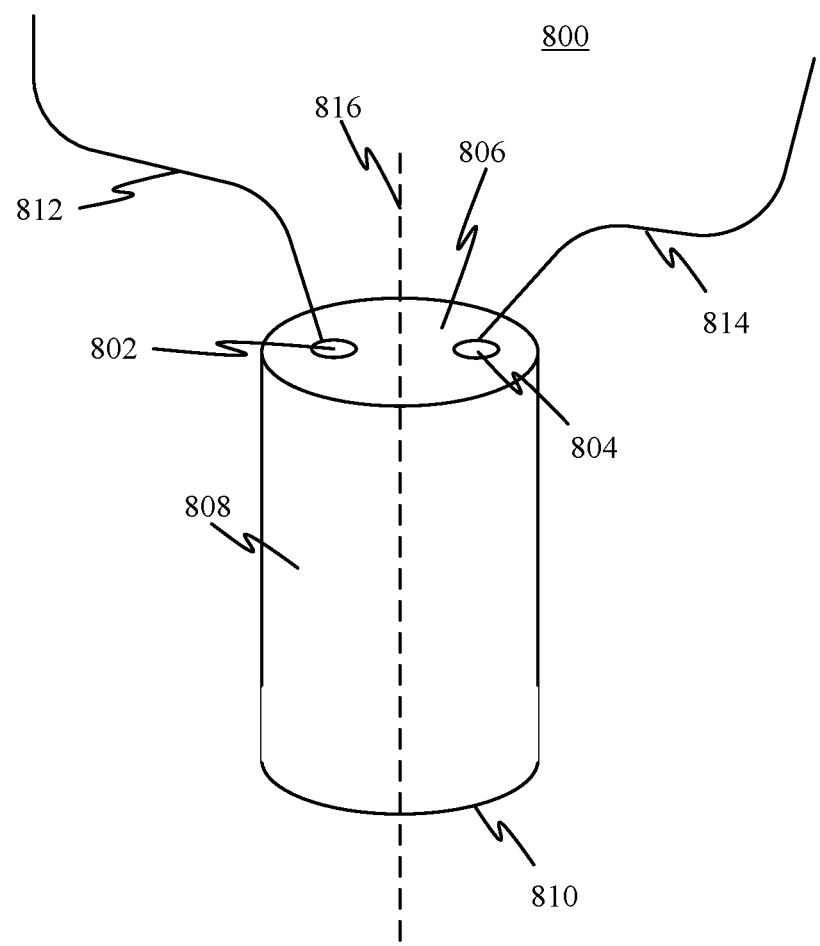
FIG. 8 illustrates an elongated battery cell according to certain embodiments.

FIG. 8 illustrates a perspective view of an elongated battery cell, which has an elongated shape that defines an axis 816. An axial face of an elongated battery cell is a surface that is intersected by the axis of the elongated shape of the battery cell. For example, axis 816 intersects two axial faces 806 and 810 of battery cell 800. Sidewall 808 is a face of battery cell 800 that axis 816 does not intersect. One example of an elongated cell shape is a cylinder. Battery cells can be mass-produced to fill a variety of roles. Therefore, battery cells can fall into one of several different shapes and sizes that can be adapted for various purposes. Some battery cells are mass-produced and have a cylindrical form factor, as illustrated.

Battery cell 800 can form part of battery module 106, for example. Battery cell 800 can provide a set voltage and be capable of providing a maximum amperage. By arranging battery cells in various series and parallel combinations, voltage and amperage values that a battery module is capable of providing can be adjusted. Battery cell 800 is illustrated as including two electrodes 802 and 804. Battery cell 800 can be configured to provide a voltage potential difference between electrodes 802 and 804. Thus, electrical power can be provided to a device via electrical paths 812 and 814. For example, an electric vehicle's electric motor can be powered by a battery module containing battery cell(s), such as battery cell 800. Electrodes 802 and 804 are illustrated as being on one axial face 806 of battery cell 800. However, electrodes 802 and 804 can be on opposite axial ends, on sidewall 808, or in various other positions on battery cell 800.

Figure 9:
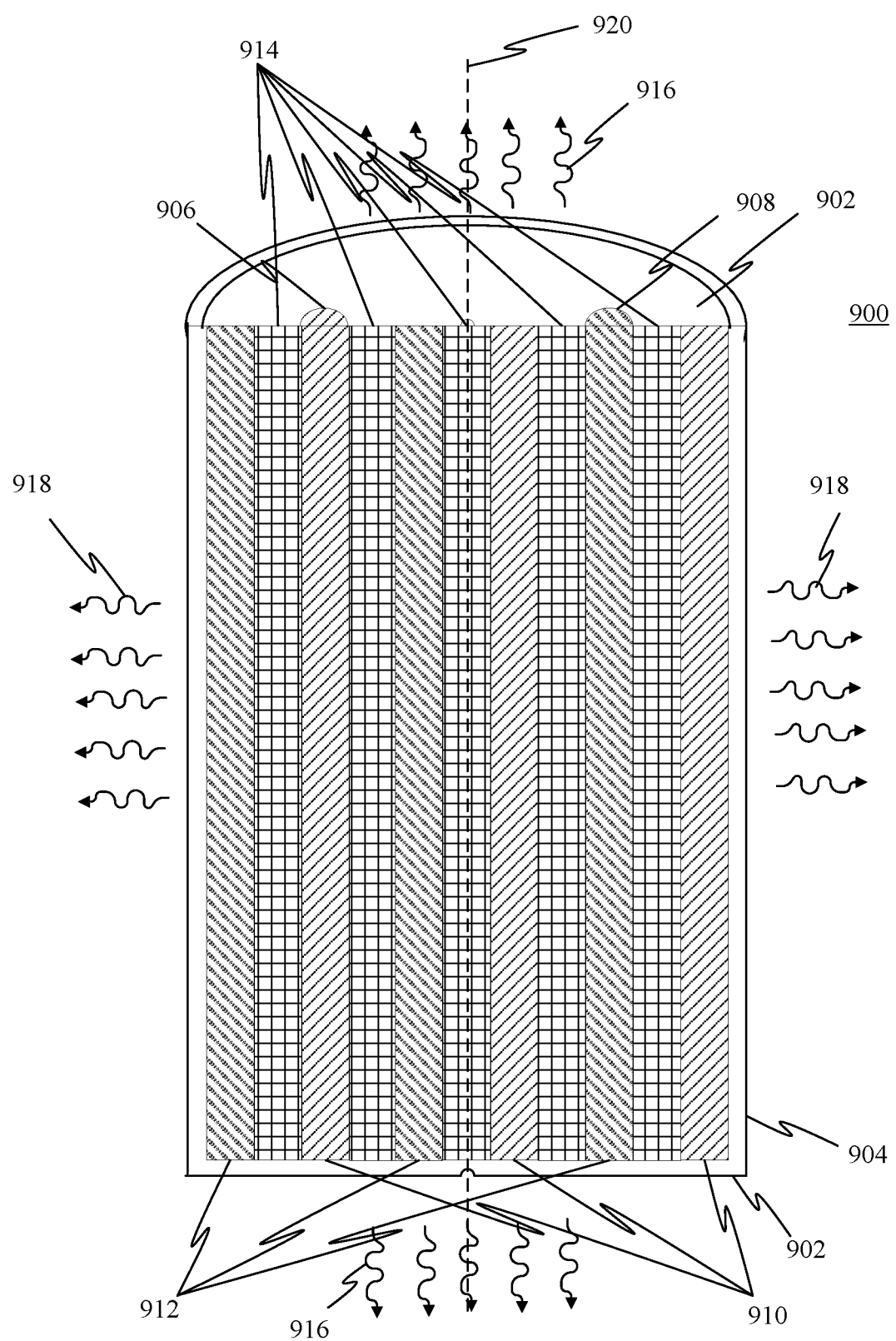
FIG. 9 illustrates a cutaway view of a battery cell.

FIG. 9 illustrates a cutaway view of a battery cell 900. Battery cell 900 can be similar to battery cell 800. Battery cell 900 can be elongated, as illustrated, such as in the shape of a cylinder. Battery cell 900 can include two axial faces 902 and a sidewall 904. Electrodes 906 and 908 can be an anode and a cathode, respectively. Each of electrodes 906 and 908 can be coupled to anode material 910 and cathode material 912, respectively. The anode material 910 and cathode material 912 can be separated by electrolyte material 914. Certain embodiments of battery cell 900 can includes alternating layers of cathode material 912, electrolyte material 914, and anode material 910 (as illustrated). In certain other embodiments, battery cell can include a central anode material section surrounded by electrolyte which is then further surrounded by a cathode material section (or vice versa). Thus, in certain embodiments, battery cell 900 can comprise longitudinally arranged layer(s) of cathode-electrolyte-anode material along axis 920.

According to embodiments of the present disclosure, a recognition of the relationship between the structure of internal components of battery cell 900 and its thermal characteristics is described in detail below. Anode material 910 and cathode material 912 can be a metallic material or other type of material and have a higher thermal conductivity than electrolyte material 914. As such electrolyte material 914 can act to (at least partially) thermally insulate anode material 910 from cathode material 912. Anode material 910 and cathode material 912 can act as thermally conductive paths between axial faces 902 of battery cell 900.

Thus, as thermal energy is generated from electrons flowing between anode material 910 and cathode material 912, the thermal energy can be conducted out from axial ends 902 via anode material 910 and cathode material 912. Axial faces 902 can emit thermal energy 916 at a higher thermal density than thermal energy 918 emitted from sidewall 904 (i.e., axial faces 902 may emit more thermal energy per unit area than sidewall 904). Cooling axial faces 902 can therefore be more beneficial for maintaining battery cell 900 operating temperatures than cooling sidewall 904.

Battery cell 900 may contain additional thermal insulating features (not shown) that may act to impede thermal transfer of heat energy to sidewall 904. For example, battery cell 900 can include structurally supportive or safety enhancing layers that may further thermally insulate cathode material, anode material, and sidewall 904. Similar thermal characteristics may be exhibited across different varieties and instances of battery cell 900. For example, electrodes 906 and 908 can be located on opposing faces of battery cell 900. Various materials can be used in construction of battery cell 900. Battery cell 900 can be a Lithium-ion battery cell, lithium-polymer battery cell, Nickel-cadmium, Nickel-metal-hydride, or other. Battery cell 900 can be rechargeable. Rechargeable battery cells can generate thermal energy when discharging or charging.

Figure 10:
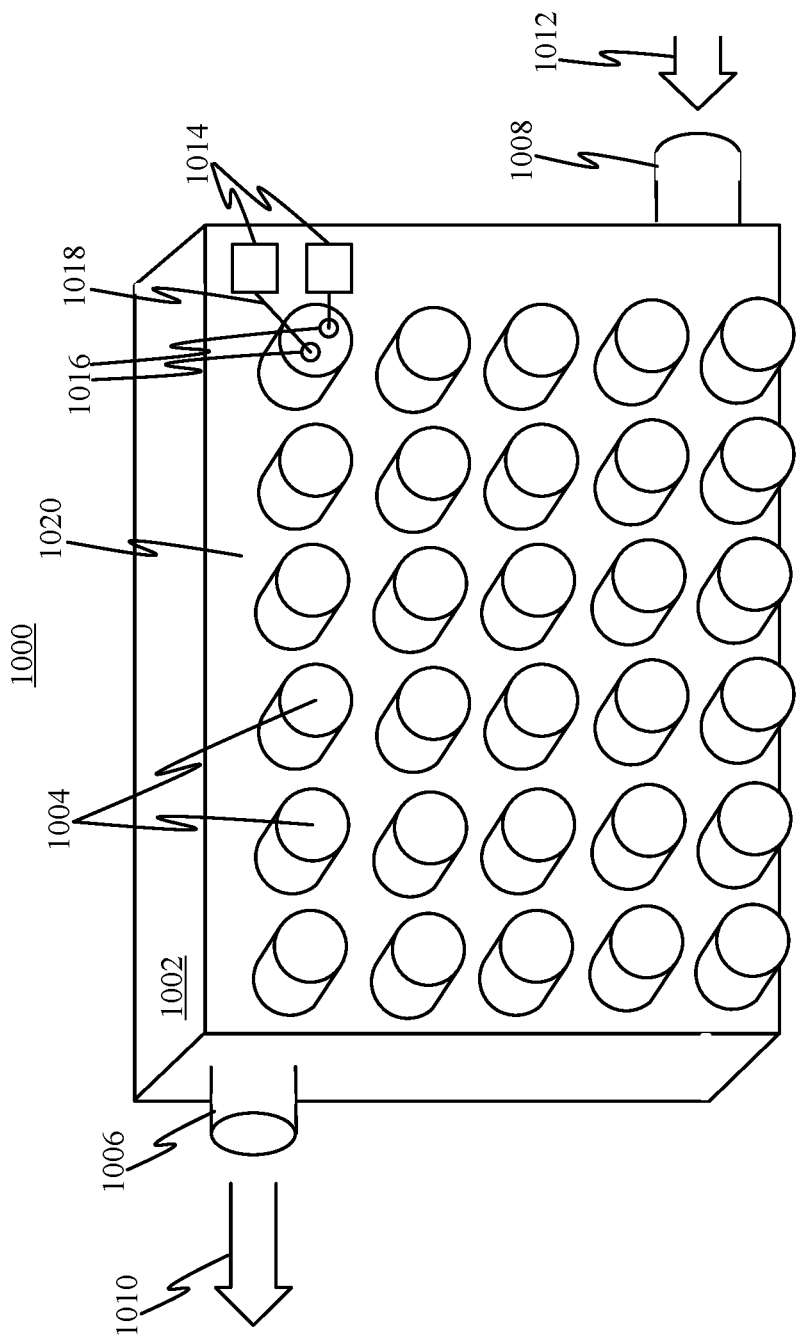
FIG. 10 illustrates a cooling plate for elongated battery cells according to certain embodiments.

FIG. 10 illustrates a heat sink module 1000 according to certain embodiments. Heat sink module 1000 can comprise a cooling plate 1002 that can be configured to be thermally coupled to axial ends of elongated battery cells 1004. For example, battery cells 1004 are illustrated as being in physical contact with a substantially planar surface 1020 of cooling plate 1002. Substantially planar surface 1020 can include indentations, protrusions, or other features without deviating from the specification. Furthermore, cooling plate 1002 can comprise various internal coolant flow channels (not illustrated) that can flow between input port 1008 and output port 1006. As illustrated, output port 1006 can be at a higher elevation than input port 1008. Arrows 1010 and 1012 illustrate the flow of coolant as it enters and exits cooling plate 1002. If a two-phase coolant is used to cool battery cells 1004, the coolant can change phase from liquid to gas. Thus, the gaseous phase coolant can rise via force of buoyancy out of output port 1006. Terminals 1014 can provide electrical contact points to provide an electrical potential difference. Terminals 1014 can be electrically coupled 1018 to electrodes 1016 of any of batteries 1004 in various parallel/series electrical combinations.

Figure 11:
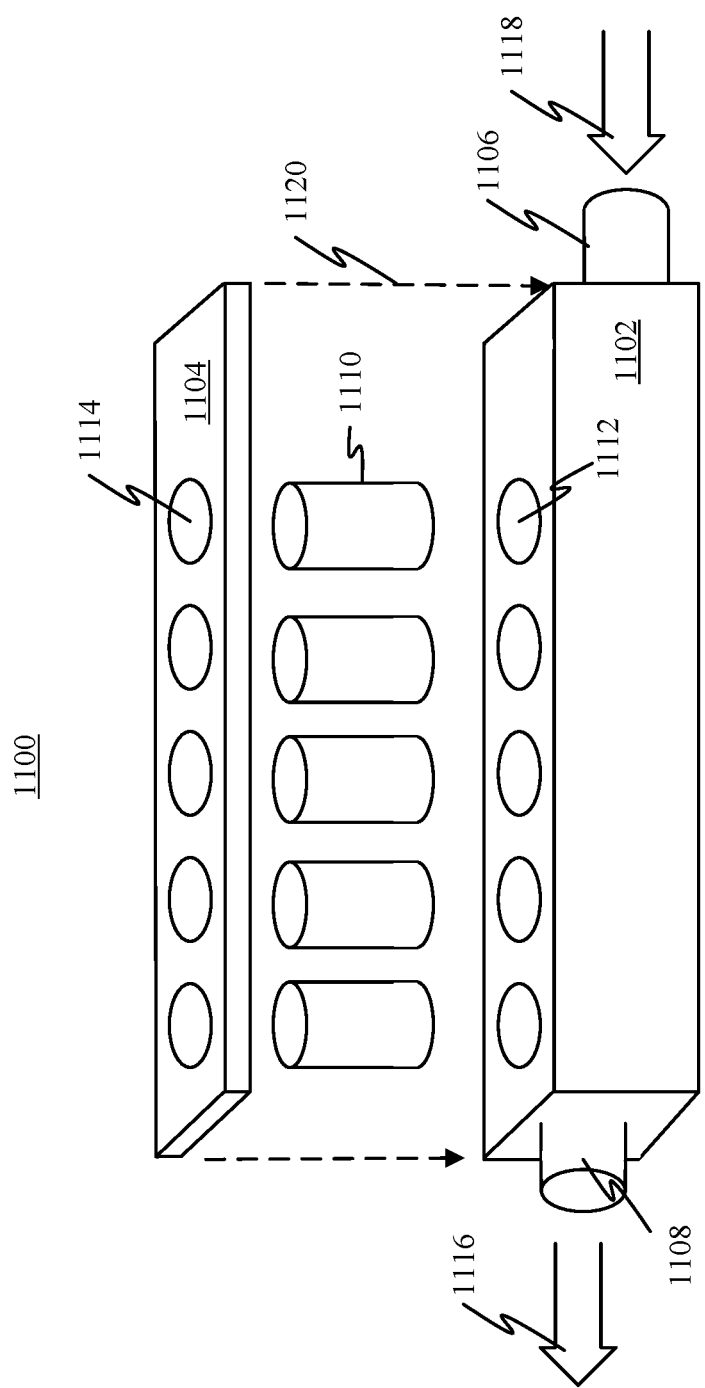
FIG. 11 illustrates a cooling plate for elongated battery cells with an attachment cover according to certain embodiments.

FIG. 11 illustrates another view of a cooling plate 1100. Cooling plate 1100 can be similar to cooling plate 1002. Cooling plate 1100 includes a base section 1102 and a cover section 1104. As illustrated, base section 1102 can define various cylindrical or other shaped indentations 1112 to accept corresponding battery cells 1110. Cover section 1104 can be secured 1120 to base section 1102 in order to securely capture battery cells 1110 within corresponding indentations 1112. Additionally, cover section 1104 can define various orifices 1114 that can be configured to provide access to electrodes of each battery cell 1110.

Various attachment mechanisms can be used to secure cover section 1104 to base section 1102. For example, fastening devices such as screws can be used to attach cover section 1104. Otherwise, latches, adhesive, or other methods can be used to secure cover section 1104 to base section 1102. Base section 1102 can include internal flow channels (not illustrated) fluidly coupling input port 1106 with output port 1108 to allow coolant to flow in direction indicated by arrows 1116 and 1118. Thus, cooling plate 1100 can include an attachment mechanism to secure axial ends of battery cells 1110 to cooling plate 1100.

Figure 12:
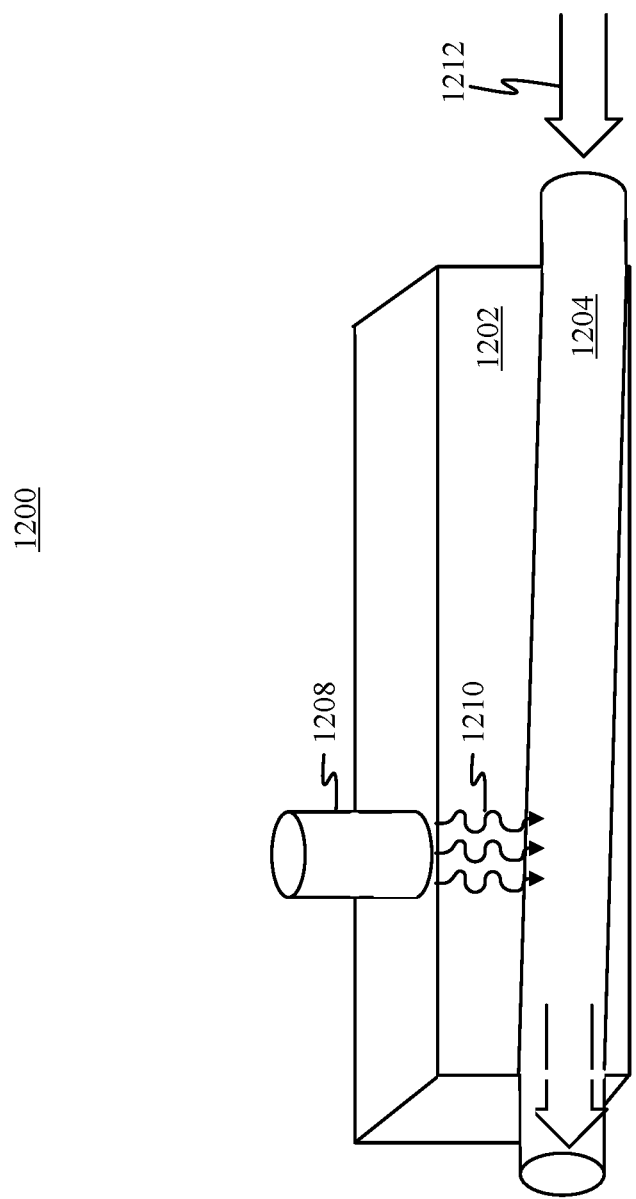
FIG. 12 illustrates a cutaway view of a cooling plate for elongated battery cells according to certain embodiments.

FIG. 12 shows a cutaway view of cooling plate 1200, which can be similar to cooling plate 1100. Cooling plate 1200 supports a battery cell 1208 mounted within an indentation defined on base section 1202. As illustrated, when battery cell 1208 is mounted to base section 1202, thermal energy 1210 from an axial face of battery cell 1208 can be thermally coupled with coolant flowing through an internal fluid channel 1204. Coolant can flow through internal flow channel 1204 in a direction indicated by arrow 1212. Coolant flowing through internal flow channel 1204 can be heated by thermal energy 1210, thus carrying away heat and cooling battery cell 1208.

Figure 13:
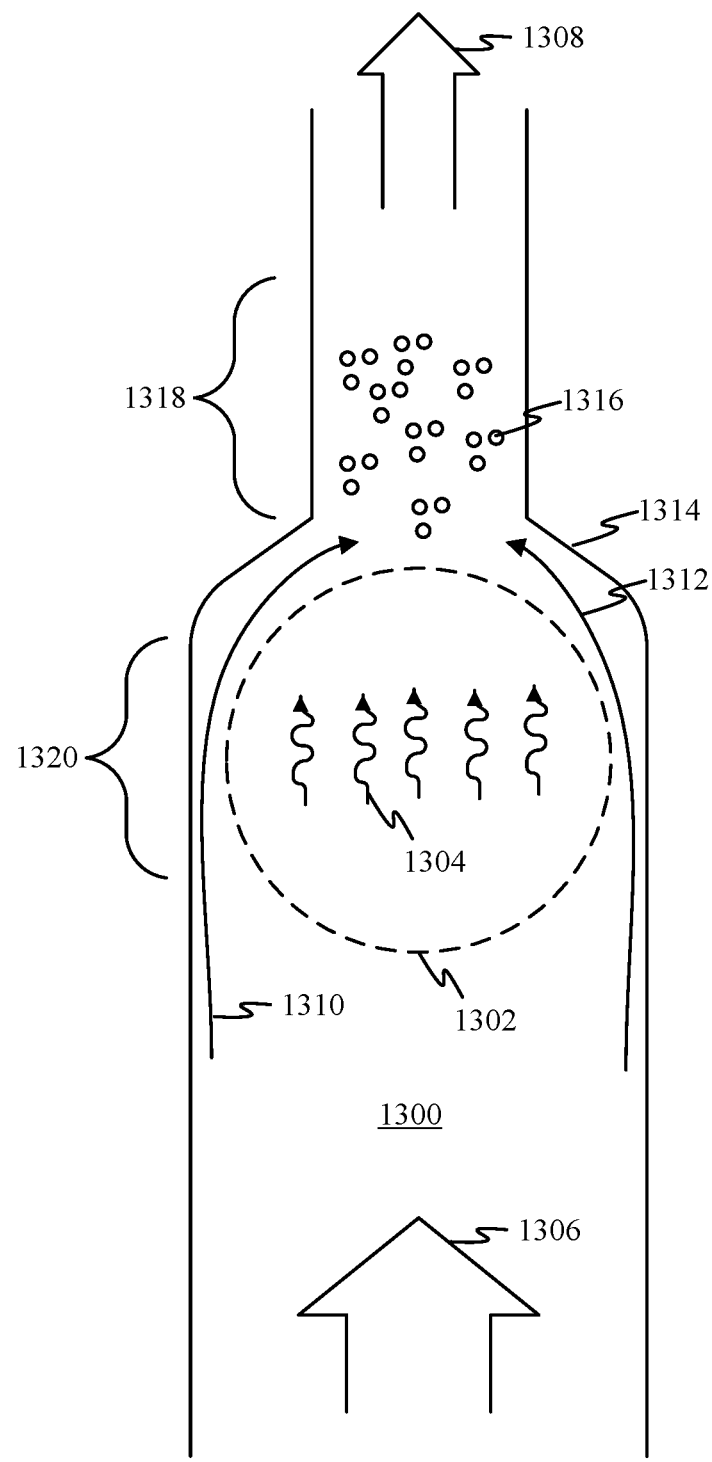
FIG. 13 illustrates an internal fluid flow channel of a cooling plate for elongated battery cells according to certain embodiments.

FIG. 13 illustrates a cutaway view of an internal flow channel 1300 according to certain embodiments. As illustrated, internal flow channel 1300 can be positioned in proximity to axial face 1302 of a battery cell (not shown) such that coolant flowing through internal flow channel 1300 can be thermally coupled to axial face 1302 of an elongated battery cell. In this manner, thermal energy 1304 emanating from axial face 1302 of the elongated battery cell can be dissipated by coolant flowing through internal flow channel 1300. As illustrated, internal flow channel 1300 can be oriented such that coolant flowing across axial face 1302 flows from a low elevation towards a higher elevation. This direction is indicated by arrows 1306 and 1308. This direction of flow can be induced by the cavitation of a two-phase coolant flowing within fluid flow channel 1300, resulting in a change of density of coolant and a fluid flow induced by effects of gravity on the coolant (e.g., buoyancy). Cavitation is illustrated by gas bubbles 1316.

Figure 14:
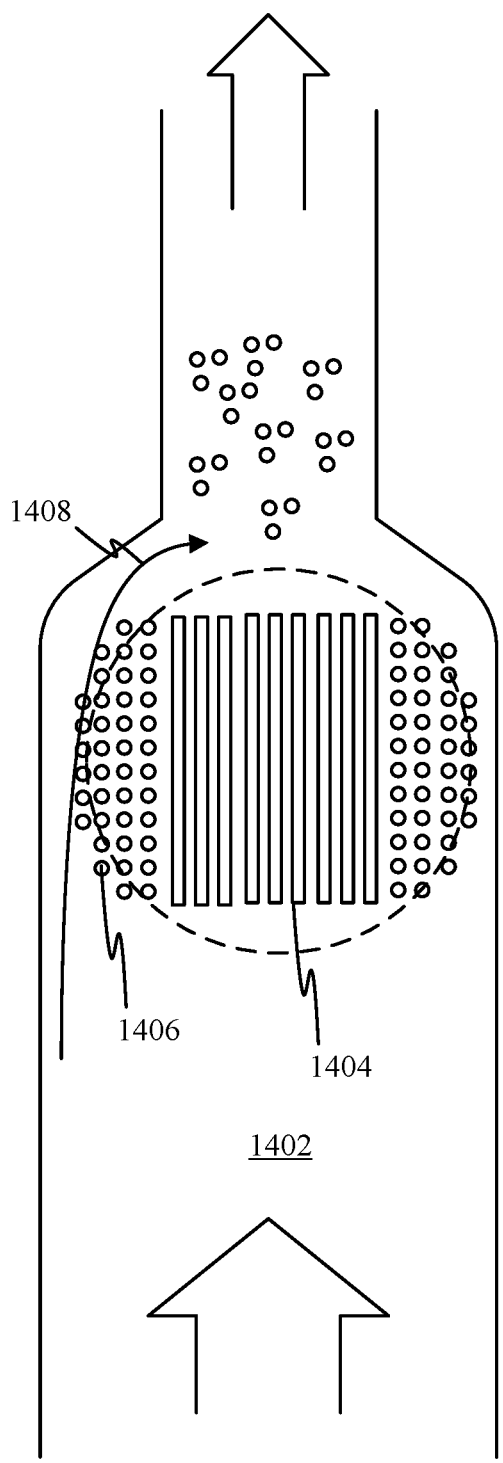
FIG. 14 illustrates features of an internal fluid flow channel of a cooling plate for elongated battery cells according to certain embodiments.

FIG. 14 illustrates internal flow channel 1402 that can be similar to internal flow channel 1300. Internal flow channel 1402 includes several micro-channels 1404. As coolant passes through micro-channels, heat can be transferred from internal flow channel 1402 to features defining the micro-channels 1404. As coolant flows through these features, the relatively large amount of contact surface area between the coolant and the micro-channels 1404 can induce a relatively large amount of thermal transfer, thus increasing the efficiency of thermal coupling between the heat sink material and the coolant. Micro-channels 1404 can be formed by, for example, machining metal that forms a heat sink module or cooling plate. Also illustrated are micro-pins 1406 that can also be used to increase the contact surface area between the heat sink material and the coolant. Micro-pins 1406 can be beneficial in areas of internal flow channel 1402 wherein flows of coolant are not unidirectional. For example, flow indicated by arrow 1408 may be induced by the shape of internal flow channel 1402. Such a flow may not be parallel with micro-channels 1404. Thus, micro-pins 1406 can allow coolant flowing through the pins in various directions without impeding flow of the coolant to a large degree. Thus, micro-pins 1406 can trade some interface surface area advantages of micro-channels 1404 to decrease fluid flow impediments. Using combinations of micro-channels of micro-pins, surface area contact between coolant and coolant flow requirements can be balanced to obtain a more efficient cooling system. Micro-pins 1406 can be cylindrical or other shapes between two surfaces of a heat sink module. In certain embodiments, an axial face of a battery cell can be cooled by a plurality of flow channels, such as flow channel 1402, and the efficiency of cooling can be improved through the use of features such as micro-channels 1404 and micro-pins 1406. Micro-channels 1404 and/or micro-pins 1406 can be machined from heat sink material, for example, to provide a relatively high thermal conductivity path between the micro-channels 1404, micro-pins 1406 and an axial face of an elongated battery cell.

Figure 15:
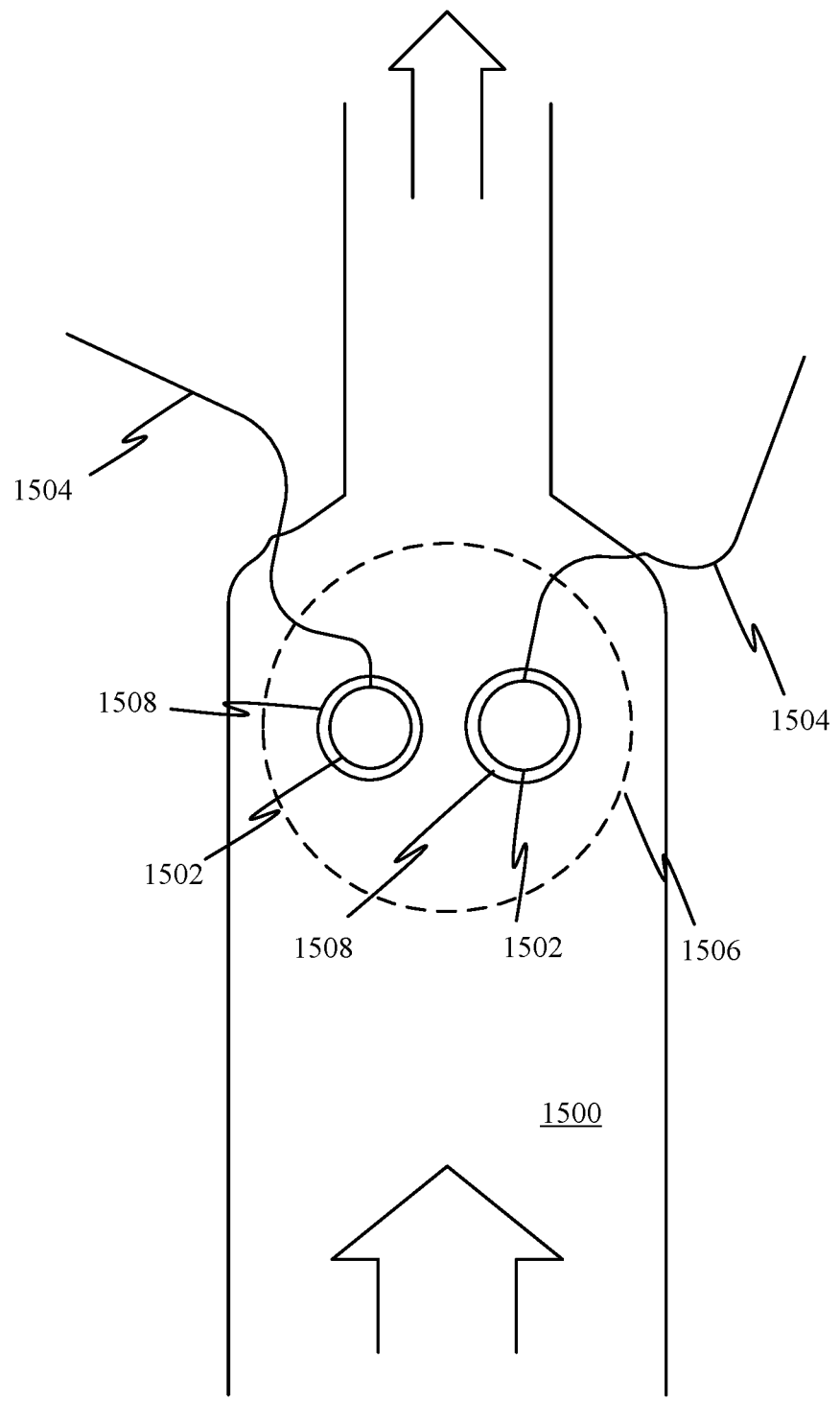
FIG. 15 illustrates electrical contact features of a cooling plate for elongated battery cells according to certain embodiments.

FIG. 15 illustrates internal flow channel 1500 that includes integrated electrode contact area(s) 1502 for interface with electrodes of axial face 1506 of an elongated battery cell. Furthermore, electrical conduction path(s) 1504 can be integrated within a cooling plate that includes internal flow channel 1500. Thus, when a battery cell is secured to a cooling plate, both an electrical path to the battery cell and a thermally conductive path to the axial face(s) of a battery cell can be formed. Electrical contact area(s) 1502 and/or electrical conduction path(s) 1504 can be insulated 1502 from fluid flow channel 1500 such that portions of the axial face(s) apart from the electrical contact areas are electrically, but not thermally, isolated from coolant flowing through internal flow channel 1500. Furthermore, Electrical contact area(s) 1502 and/or electrical conduction path(s) 1504 can be insulated 1502 from material of a heat sink module, including fluid flow channel 1500.

The features of FIG. 15 can be integrated into a base section 1102 and/or a cover section 1104 of a cooling plate. Thus, both axial faces of an elongated battery can be cooled in certain embodiments. Additionally, if electrodes are located on opposing axial faces of elongated battery, an electrical path can be formed to both electrodes of the battery cell. If electrodes are on the same face of the battery cell, electrical path can still be formed with the electrodes. The features of FIG. 15 can reduce assembly and maintenance times for a battery module/heat sink interface by combing electrical and thermal interfaces to a battery cell into a common structure.

Figure 16:
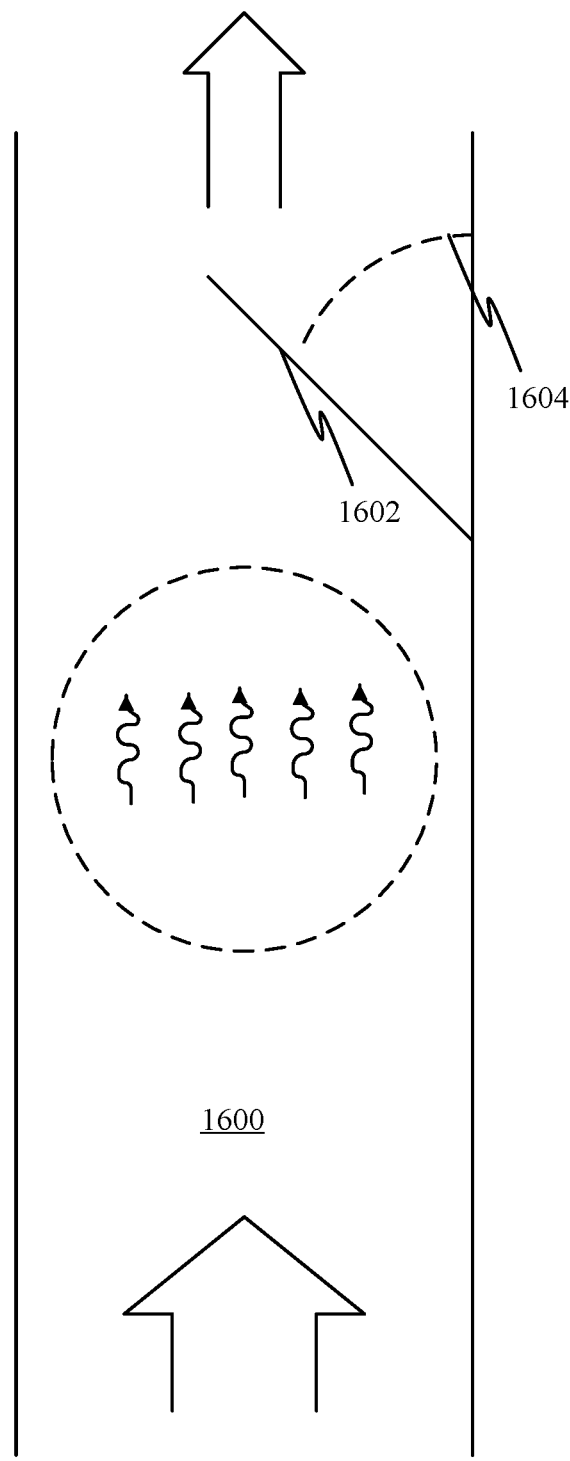
FIG. 16 illustrates variable flow features of an internal fluid flow channel of a cooling plate for elongated battery cells according to certain embodiments.

FIG. 16 illustrates additional features of an internal flow channel according to certain embodiments. Internal flow channel 1600 includes a variable valve 1602. Valve 1602 is illustrated as being movable through arc 1604. It should be understood that the cross-sectional illustration shown in FIG. 16 is meant to be a functional illustration and not limit the structure of such a device. Valve 1602 can be operable to adjust the flow of coolant through internal flow channel 1600 and/or to stop flow through internal flow channel 1600. Additionally, valve 1602 can be operable to change a difference in pressure between two different areas of internal flow channel 1600. Valve 1602 can be communicatively coupled to a controller (not shown). The controller can be communicatively coupled to a plurality of internal flow channels each with a corresponding variable valve. Thus, the controller can alter flows between individual internal flow channels depending upon various conditions of battery cells. For example, certain battery cells may be operating at a higher temperature than other battery cells. If so, the controller can alter the configuration of various valves, such as valve 1602, to provide more cooling to the relatively hotter battery cells. This information can be gathered by thermal sensors that are thermally coupled to each battery cell.

Figure 17:
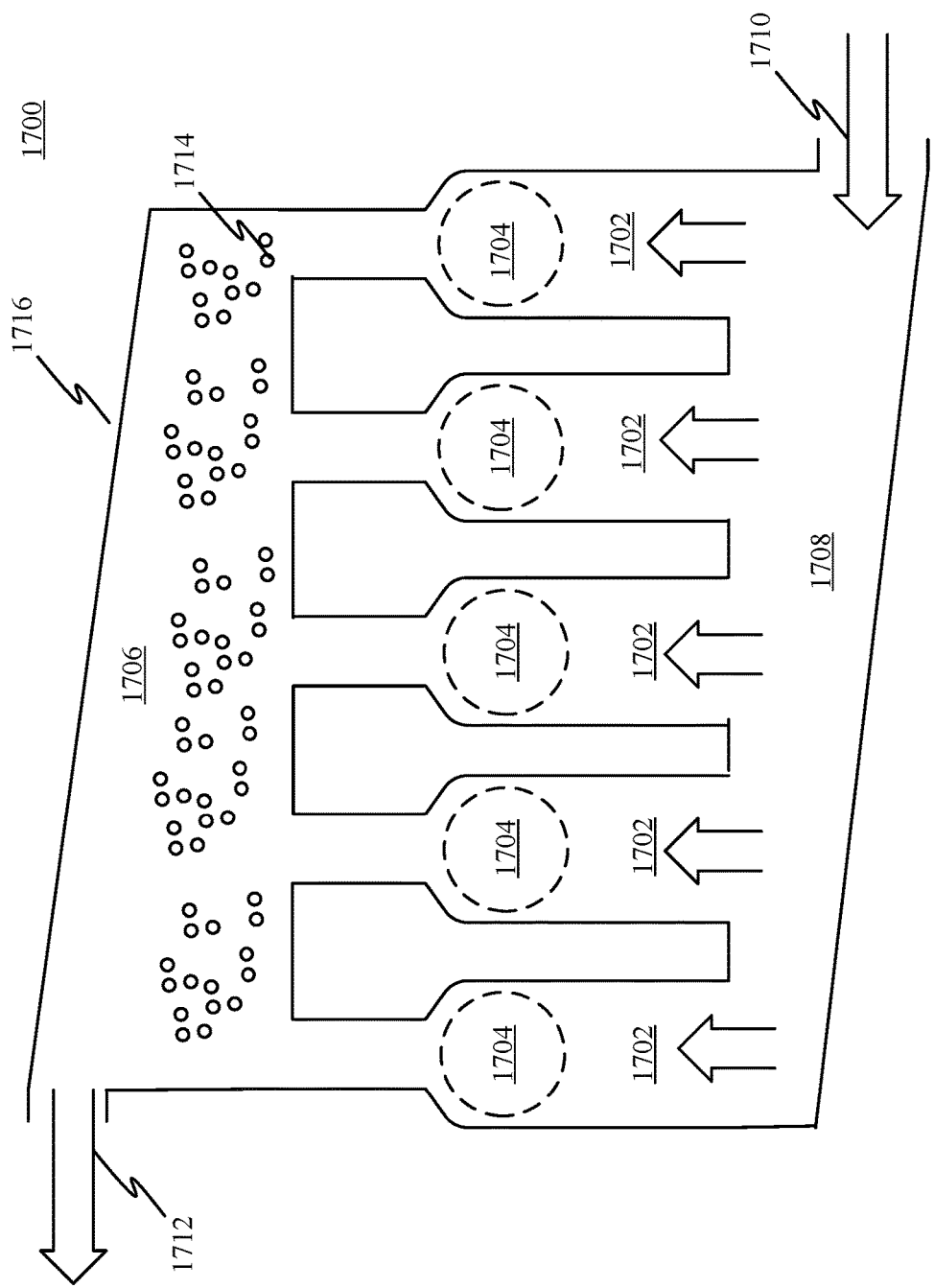
FIG. 17 illustrates features of internal fluid flow channels of a cooling plate for elongated battery cells according to certain embodiments.

FIG. 17 illustrates a cross-sectional, functional view of unified structure comprising several internal flow channels 1702 as part of a cooling plate 1700. As illustrated, each internal flow channel 1702 can be configured to be in parallel and correspond to one axial battery face 1704. The term parallel is not meant to limit an orientation of the internal flow channels 1702. Instead, the term parallel refers to a configuration in which the internal flow channels 1702 have a common input and/or output. For example, coolant entering cooling plate 1700 in the direction of arrow 1710 can enter a chamber 1708 that is fluidly coupled to each of internal flow channels 1702. As the coolant flows upward across axial faces of battery cells, the coolant can be heated to induce phase change of the coolant. As the coolant changes phase, a convection current flow can be induced such that coolant flows upward into chamber 1706. This chamber can be a common chamber fluidly coupled to a plurality of internal flow channels 1702, as illustrated. Furthermore, chamber 1706 can be defined to include features of exterior walls 1716, such that less dense/heated coolant exits the cooling plate in direction indicated by arrow 1712. This configuration can ensure that no gaseous state coolant enters an internal flow channel and compromises the ability of an internal flow channel to cool a corresponding battery cell. The configuration illustrated in FIG. 17 can be repeated across horizontal rows of battery cells arranged at different elevations within a cooling plate. For example, each row in a cooling plate can be associated with a common feed chamber 1708 and exit chamber 1706 to prevent gaseous state coolant from entering an internal flow channel 1702.

Figure 18:
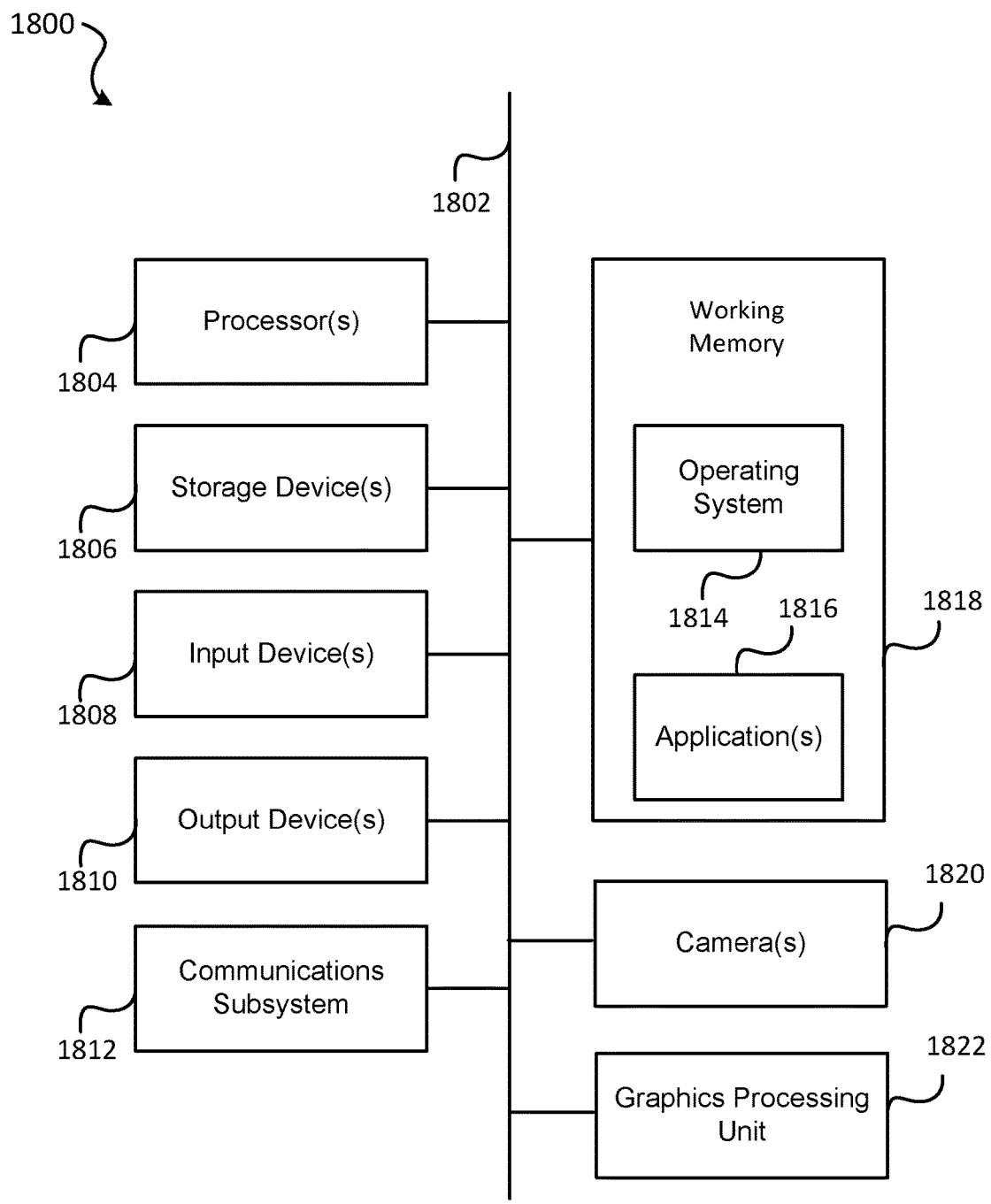
FIG. 18 illustrates an example computer system for implementing features of certain embodiments.

FIG. 18 illustrates an example computer system 1800 that can be used to implement features of the disclosure (such as for a controller). Computer system 1800 is shown comprising hardware elements that can be electrically coupled via a bus 1802 (or may otherwise be in communication, as appropriate). The hardware elements may include one or more processors 1804, including without limitation one or more general-purpose processors and/or one or more special-purpose processors (such as digital signal processing chips, graphics processing units 1822, and/or the like); one or more input devices 1808, which can include without limitation one or more cameras, sensors, a mouse, a keyboard, a microphone configured to detect ultrasound or other sounds, and/or the like; and one or more output devices 1810, which can include without limitation a display unit such as the device used in implementations of the invention, a printer and/or the like. Additional cameras 1820 may be employed for detection of user's extremities and gestures. In some implementations, input devices 1808 may include one or more sensors such as infrared, depth, and/or ultrasound sensors. The graphics processing unit 1822 may be used to carry out the method for real-time wiping and replacement of objects described above.

In some implementations of the implementations of the invention, various input devices 1808 and output devices 1810 may be embedded into interfaces such as display devices, tables, floors, walls, and window screens. Furthermore, input devices 1808 and output devices 1810 coupled to the processors may form multi-dimensional tracking systems.

The computer system 1800 may further include (and/or be in communication with) one or more non-transitory storage devices 1806, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data storage, including without limitation, various file systems, database structures, and/or the like.

The computer system 1800 might also include a communications subsystem 1812, which can include without limitation a modem, a network card (wireless or wired), an infrared communication device, a wireless communication device and/or chipset (such as a Bluetooth device, an 802.11 device, a WiFi device, a WiMax device, cellular communication facilities, etc.), and/or the like. The communications subsystem 1812 may permit data to be exchanged with a network, other computer systems, and/or any other devices described herein. In many implementations, the computer system 1800 will further comprise a non-transitory working memory 1820, which can include a RAM or ROM device, as described above.

The computer system 1800 also can comprise software elements, shown as being currently located within the working memory 1820, including an operating system 1814, device drivers, executable libraries, and/or other code, such as one or more application programs 1816, which may comprise computer programs provided by various implementations, and/or may be designed to implement methods, and/or configure systems, provided by other implementations, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a computer-readable storage medium, such as the storage device(s) 1806 described above. In some cases, the storage medium might be incorporated within a computer system, such as computer system 1800. In other implementations, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which may be executable by the computer system 1800 and/or might take the form of source and/or installable code, which, upon compilation and/or installation on the computer system 1800 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed. In some implementations, one or more elements of the computer system 1800 may be omitted or may be implemented separate from the illustrated system. For example, the processor 1804 and/or other elements may be implemented separate from the input device 1808. In one implementation, the processor may be configured to receive images from one or more cameras that are separately implemented. In some implementations, elements in addition to those illustrated in FIG. 4 may be included in the computer system 1800.

Some implementations may employ a computer system (such as the computer system 1800) to perform methods in accordance with the disclosure. For example, some or all of the procedures of the described methods may be performed by the computer system 1800 in response to processor 1804 executing one or more sequences of one or more instructions (which might be incorporated into the operating system 1814 and/or other code, such as an application program 1816) contained in the working memory 1820. Such instructions may be read into the working memory 1820 from another computer-readable medium, such as one or more of the storage device(s) 1806. Merely by way of example, execution of the sequences of instructions contained in the working memory 1820 might cause the processor(s) 1804 to perform one or more procedures of the methods described herein.

The terms "machine-readable medium" and "computer-readable medium," as used herein, refer to any medium that participates in providing data that causes a machine to operate in a specific fashion. In some implementations implemented using the computer system 1800, various computer-readable media might be involved in providing instructions/code to processor(s) 1804 for execution and/or might be used to store and/or carry such instructions/code (e.g., as signals). In many implementations, a computer-readable medium may be a physical and/or tangible storage medium. Such a medium may take many forms, including but not limited to, non-volatile media, volatile media, and transmission media. Non-volatile media include, for example, optical and/or magnetic disks, such as the storage device(s) 1806. Volatile media include, without limitation, dynamic memory, such as the working memory 1820. Transmission media include, without limitation, coaxial cables, copper wire and fiber optics, including the wires that comprise the bus 1802, as well as the various components of the communications subsystem 1812 (and/or the media by which the communications subsystem 1812 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 1804 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 1800. These signals, which might be in the form of electromagnetic signals, acoustic signals, optical signals and/or the like, are all examples of carrier waves on which instructions can be encoded, in accordance with various implementations of the invention.

The communications subsystem 1812 (and/or components thereof) generally will receive the signals, and the bus 1802 then might carry the signals (and/or the data, instructions, etc. carried by the signals) to the working memory 1820, from which the processor(s) 1804 retrieves and executes the instructions. The instructions received by the working memory 1820 may optionally be stored on a non-transitory storage device either before or after execution by the processor(s) 1804.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Moreover, nothing disclosed herein is intended to be dedicated to the public.

While some examples of methods and systems herein are described in terms of software executing on various machines, the methods and systems may also be implemented as specifically-configured hardware, such as field-programmable gate array (FPGA) specifically to execute the various methods. For example, examples can be implemented in digital electronic circuitry, or in computer hardware, firmware, software, or in a combination thereof. In one example, a device may include a processor or processors. The processor comprises a computer-readable medium, such as a random access memory (RAM) coupled to the processor. The processor executes computer-executable program instructions stored in memory, such as executing one or more computer programs. Such processors may comprise a microprocessor, a digital signal processor (DSP), an application-specific integrated circuit (ASIC), field programmable gate arrays (FPGAs), and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices.

Such processors may comprise, or may be in communication with, media, for example computer-readable storage media, that may store instructions that, when executed by the processor, can cause the processor to perform the steps described herein as carried out, or assisted, by a processor. Examples of computer-readable media may include, but are not limited to, an electronic, optical, magnetic, or other storage device capable of providing a processor, such as the processor in a web server, with computer-readable instructions. Other examples of media comprise, but are not limited to, a floppy disk, CD-ROM, magnetic disk, memory chip, ROM, RAM, ASIC, configured processor, all optical media, all magnetic tape or other magnetic media, or any other medium from which a computer processor can read. The processor, and the processing, described may be in one or more structures, and may be dispersed through one or more structures. The processor may comprise code for carrying out one or more of the methods (or parts of methods) described herein.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

The foregoing description of some examples has been presented only for the purpose of illustration and description and is not intended to be exhaustive or to limit the disclosure to the precise forms disclosed. Numerous modifications and adaptations thereof will be apparent to those skilled in the art without departing from the spirit and scope of the disclosure.

Reference herein to an example or implementation means that a particular feature, structure, operation, or other characteristic described in connection with the example may be included in at least one implementation of the disclosure. The disclosure is not restricted to the particular examples or implementations described as such. The appearance of the phrases "in one example," "in an example," "in one implementation," or "in an implementation," or variations of the same in various places in the specification does not necessarily refer to the same example or implementation. Any particular feature, structure, operation, or other characteristic described in this specification in relation to one example or implementation may be combined with other features, structures, operations, or other characteristics described in respect of any other example or implementation.

Use herein of the word "or" is intended to cover inclusive and exclusive OR conditions. In other words, A or B or C includes any or all of the following alternative combinations as appropriate for a particular usage: A alone; B alone; C alone; A and B only; A and C only; B and C only; and A and B and C.

The term "vehicle," as used herein, means a device used for transporting people or goods. Examples of vehicles include automobiles, motorcycles, cars, trucks, boats, trains, and airplanes.

What is claimed is:

1. A vehicular cooling system comprising:
   a heat radiator module having an input port and an output port;
   a heat sink module having an input port and an output port;
   a high temperature fluid path coupling the output port of the heat sink module to the input port of the heat radiator module, for transferring a two-phase coolant from the heat sink module to the heat radiator module;
   a low temperature fluid path coupling the output port of the heat radiator module to the input port of the heat sink module, for transferring the two-phase coolant from the heat radiator module to the heat sink module;
   wherein the heat radiator module is configured to cool the two-phase coolant into a substantially liquid form, and wherein the heat radiator module is further configured to be located within a vehicle at a higher elevation than the heat sink module, such that the two-phase coolant, in substantially liquid form, is moved from the heat radiator module to the heat sink module primarily by force of gravity; and
   wherein the heat sink module is configured to be thermally coupled to a heat-generating component located within the vehicle at a lower elevation than the heat radiator module and transfer heat from the heat-generating component to heat the two-phase coolant into a substantially gaseous form, and wherein the heat sink module is configured to be located within the vehicle at lower elevation than the heat radiator module, such that the two-phase coolant, in substantially gaseous form, is moved primarily by force of buoyancy from the heat sink module to the heat radiator module.

2. The vehicular cooling system of claim 1 wherein the heat-generating component comprises a battery module.

3. The vehicular cooling system of claim 2, wherein the heat sink module comprises a cooling plate configured to make physical contact with the battery module.

4. The vehicular cooling system of claim 3, wherein the battery module includes an elongated battery and the cooling plate is configured to make physical contact with an axial face of the elongated battery.

5. The vehicular cooling system of claim 1, further comprising a reservoir disposed and fluidly coupled between the heat sink module and the heat radiator module, the system configured to circulate:
   the two-phase coolant in substantially liquid form between the heat sink module and reservoir; and
   the two-phase coolant in substantially gaseous form the reservoir to the heat radiator module.

6. The vehicular cooling system of claim 1, further comprising:
   a pressure compensation unit configured to adjust an amount of pressure within the system, wherein the system includes a closed loop coolant path isolating the two-phase coolant from an atmosphere external to the system.

7. The vehicular cooling system of claim 6, further comprising:
   a controller configured to cause the pressure compensation unit to adjust the amount of pressure within the system to regulate an amount of flow induced by gravity based on at least one of:
   a temperature external to the vehicle;
   an atmospheric pressure;
   a difference in pressure between a pressure within the system and an atmospheric pressure; or
   a combination of the preceding.

8. The vehicular cooling system of claim 6, further comprising:
   a metering valve configured to variably modulate a pressure difference between two different sections of the closed loop coolant path.

9. The vehicular cooling system of claim 1, further comprising:
   a thermal modulator thermally coupled to coolant flowing through the cooling system, the thermal modulator configured to remove or add thermal energy to the coolant flowing through the cooling system.

10. The vehicular cooling system of claim 1, further comprising:
    a pump configured to circulate the two-phase coolant between the heat radiator module and the heat sink module; and
    a bypass value configured to fluidly couple or de-couple the pump from the system.

11. The vehicular cooling system of claim 1, further comprising:
    a pump configured to cause the two-phase coolant to flow between the heat radiator module and the heat sink module; and
    a controller configured to:
    enable the pump to cause the two-phase coolant to flow between the heat radiator module and the heat sink module when a condition is met; and
    disable the pump from inducing the two-phase coolant to flow between the heat radiator module and the heat sink module when the condition is not met.

12. The vehicular cooling system of claim 11, wherein the condition includes at least one of:
    a temperature external to the vehicle;
    an atmospheric pressure value external to the vehicle;
    an internal pressure of the cooling system;
    an internal temperature of the cooling system;
    a combination of the preceding.

13. A modular vehicular cooling system comprising:
a heat radiator module;
a plurality of heat sink modules;
a plurality of reservoirs;
a first plurality of high temperature fluid paths each fluidly coupling one of the plurality of heat sink modules to one of the plurality of reservoirs for transferring a two-phase coolant from the one heat sink module to the coupled one reservoir;
a second plurality of high temperature fluid paths each fluidly coupling one of the plurality of reservoirs to the heat radiator module for transferring the two-phase coolant from the coupled one reservoir to the heat radiator module;
a first plurality of low temperature fluid paths each fluidly coupling the heat radiator module to one of the plurality of reservoirs for transferring the two-phase coolant from the heat radiator module to the coupled one reservoir;
a second plurality of low temperature fluid paths fluidly each fluidly coupling one of the radiators to one of the plurality of heat sink modules, for transferring the two-phase coolant from the coupled one reservoir to the coupled one heat sink module;
wherein the heat radiator module is configured to cool the two-phase coolant into a substantially liquid form, and wherein the heat radiator module is further configured to be located within a vehicle at a higher elevation than the plurality of reservoirs, such that the two-phase coolant, in substantially liquid form, is moved from the heat radiator module to the plurality of reservoirs;
wherein each of the plurality of heat sink modules is configured to be thermally coupled to a heat-generating component located within the vehicle at a lower elevation than the heat radiator module and transfer heat from the heat-generating component to heat the two-phase coolant into a substantially gaseous form, and wherein the one heat sink module is configured to be located within the vehicle at lower elevation than the plurality of reservoirs, such that the two-phase coolant, in substantially gaseous form, is moved primarily by force of buoyancy from each of the plurality of heat sink modules to a reservoir of the plurality of reservoirs; and
wherein two of the plurality of heat sink modules are fluidly coupled to one of the plurality of reservoirs such that the two-phase coolant flows from the two heat sink modules to the one reservoir via a fluid current induced by heat from the heat-generating component.

14. The modular vehicular cooling system of claim 13, wherein two of the plurality of reservoirs is fluidly coupled to the heat radiator module such that the two-phase coolant flows from the two reservoirs to the heat radiator module in a substantially gaseous phase.

15. The modular vehicular cooling system of claim 13, further comprising:
a plurality of metering valves each coupled between a reservoir of the plurality of reservoirs and the heat radiator module;
a controller configured to adjust each of the plurality of metering valves to individually control flow of the two-phase coolant between each reservoir and the heat radiator module.

16. The modular vehicular cooling system of claim 15, further comprising:
a plurality of thermal sensors, each coupled to a heat-generating component thermally coupled to a respective heat sink module, wherein the controller is configured to adjust a metering valve fluidly coupled to the respective heat sink module based on a temperatures value determined from the one of the plurality of thermal sensors coupled to the heat-generating component thermally coupled to the respective heat sink module.

17. The modular vehicular cooling system of claim 15, further comprising:
a pump configured to cause the two-phase coolant to flow between a reservoir of the plurality of reservoirs e and a heat sink module of the plurality of heat sink modules; and
a controller configured to:
enable the pump to cause the two-phase coolant to flow between the reservoir and the heat sink module when a condition is met; and
disable the pump from causing the two-phase coolant to flow between the reservoir and the heat sink module when the condition is not met.

18. A vehicle, comprising:
a heat radiator module having an input port and an output port;
a heat sink module having an input port and an output port;
a high temperature fluid path coupling the output port of the heat sink module to the input port of the heat radiator module, for transferring a two-phase coolant from the heat sink module to the heat radiator module;
a low temperature fluid path coupling the output port of the heat radiator module to the input port of the heat sink module, for transferring the two-phase coolant from the heat radiator module to the heat sink module;
wherein the heat radiator module is configured to cool the two-phase coolant into a substantially liquid form, and wherein the heat radiator module is located within the vehicle at a higher elevation than the heat sink module, such that the two-phase coolant, in substantially liquid form, is moved from the heat radiator module to the heat sink module; and
wherein the heat sink module is configured to be thermally coupled to a heat-generating component located within the vehicle at a lower elevation than the heat radiator module and transfer heat from the heat-generating component to heat the two-phase coolant into a substantially gaseous form, and wherein the heat sink module is configured to be located within the vehicle at lower elevation than the heat radiator module, such that the two-phase coolant, in substantially gaseous form, is moved primarily by force of buoyancy from the heat sink module to the heat radiator module.

19. The vehicle of claim 18, wherein the heat radiator module is thermally coupled to a passenger compartment of the vehicle wherein heat emitted from the heat radiator module can be transferred to passengers within the passenger compartment.

20. The vehicle of claim 18, further comprising:
a pump configured to cause the two-phase coolant to flow between the heat radiator module and the heat sink module; and
a controller configured to:
enable the pump to cause the two-phase coolant to flow between the heat radiator module and the heat sink module when a condition is met; and disable the pump from causing the two-phase coolant to flow between the heat radiator module and the heat sink module when the condition is not met.

* * * * *